(12) United States Patent
Tsukiyama et al.

(10) Patent No.: US 6,489,679 B2
(45) Date of Patent: Dec. 3, 2002

(54) HIGH-FREQUENCY PACKAGE

(75) Inventors: Yoshio Tsukiyama, Osaka (JP); Masato Shiobara, Hyogo (JP); Yoshihisa Araya, Kanagawa (JP)

(73) Assignee: Sumitomo Metal (SMI) Electronics Devices Inc., Mine (JP)

( * ) Notice: Subject to any disclaimer, the term of this patent is extended or adjusted under 35 U.S.C. 154(b) by 15 days.

(21) Appl. No.: 09/729,708

(22) Filed: Dec. 6, 2000

(65) Prior Publication Data

US 2001/0004129 A1 Jun. 21, 2001

(30) Foreign Application Priority Data

Dec. 6, 1999 (JP) .......................................... 11-346698
Jul. 18, 2000 (JP) ....................................... 2000-217133

(51) Int. Cl.[7] .............................................. H01L 23/34
(52) U.S. Cl. ...................................... 257/728; 257/691
(58) Field of Search ................................ 257/728, 691, 257/664; 333/264; 343/700; H01P 3/08

(56) References Cited

U.S. PATENT DOCUMENTS

| | | | | |
|---|---|---|---|---|
| 5,451,818 A | * | 9/1995 | Chan et al. | 257/728 |
| 5,465,008 A | * | 11/1995 | Goetz | 257/691 |
| 6,028,497 A | * | 2/2000 | Allen et al. | 333/246 |
| 6,043,556 A | * | 3/2000 | Tomie | 257/664 |
| 6,057,600 A | * | 5/2000 | Kitazawa et al. | 257/728 |
| 6,271,579 B1 | * | 8/2001 | Going et al. | 257/664 |
| 6,320,543 B1 | * | 11/2001 | Ohata et al. | 343/700 |

FOREIGN PATENT DOCUMENTS

| | | | | |
|---|---|---|---|---|
| JP | 2603310 | | 1/1997 | ............. H01P/3/02 |
| JP | 02001144509 A | * | 5/2001 | ............. H01P/3/08 |

* cited by examiner

*Primary Examiner*—David Nelms
*Assistant Examiner*—Thinh Nguyen
(74) *Attorney, Agent, or Firm*—Wenderoth, Lind & Ponack, L.L.P.

(57) ABSTRACT

A highfrequency package has an excellent high-frequency characteristic in a band from quasi-millimeter wavelength to 90 GHz frequency. A sealed construction can be easily manufactured, leading to a reduction in cost, and is excellent in strength. A ring-shaped frame and signal lines facing each other with the ring-shaped frame between in the inside and outside regions separated by the ring-shaped frame are formed on one main surface side of a dielectric substrate, and grounds are formed around the signal lines with gaps interposed between in the same plane, while signal lines and a ground around the signal lines with gaps interposed between in the same plane are formed on the other main surface side of the dielectric substrate, wherein conductive vias for vertically connecting each of one end portions of the signal lines and both end portions of the signal line are formed, and a plurality of conductive vias for vertically connecting the grounds and the ground are formed at prescribed intervals on both sides with the signal lines between.

13 Claims, 20 Drawing Sheets

HIGH-FREQUENCY PACKAGE

BACKGROUND OF THE INVENTION

1. Field of the Invention

The present invention relates to a high-frequency package and, more particularly, to a high-frequency package accommodating a semiconductor device and a high-frequency circuit being formed on the periphery of the device, for which high-frequency signals in a band of quasi-millimeter wavelengths and about 30–90 GHz frequencies are used.

2. Description of the Relevant Art

A high-frequency package is constructed by a semiconductor device mounting area and a high-frequency circuit on the periphery of the device, and both are formed on a dielectric substrate, being hermetically sealed with a ring-shaped frame and a lid to be jointed thereon. High-frequency signals are input and output through signal lines passing through the bottom of the ring-shaped frame.

FIGS. 1a and 1b are schematic diagrams showing a conventional high-frequency package of this type, and FIG. 1a is a sectional side view, while FIG. 1b is a sectional perspective view along line B—B of FIG. 1a.

A dielectric substrate 41 is formed almost in the shape of a rectangular parallelepiped board having a thickness T. A ground 42 is formed on the bottom surface 41b of the dielectric substrate 41, while a ring-shaped frame 44 made of dielectrics is arranged in a prescribed place on the top surface 41a of the dielectric substrate 41. A plurality of thin-film-like circuit strips 43a having a width of $w_1$ are formed in prescribed places on the top surface 41a in the inside region 44d of the frame 44, while lead strips 43b similar to those (having a width of $w_1$) are formed outside the frame 44, facing the circuit strips 43a with the frame 44 between. One end portion of the circuit strip 43a and one end portion of the lead strip 43b are connected through a connecting strip 43c having a width of $w_2$, which is buried under the frame 44. A signal line 43 includes these circuit strip 43a, lead strip 43b, and connecting strip 43c.

In order to equalize the characteristic impedance of a circuit including the connecting strip 43c and the frame 44 thereabout to those of the circuit strip 43a and the lead strip 43b, the width $w_2$ of the connecting strip 43c is set to be smaller than the widths $w_1$ of the circuit strip 43a and the lead strip 43b. In order to hold down the return loss in the signal line 43 and to make the insertion loss smaller, each characteristic impedance in the circuit strip 43a, lead strip 43b and connecting strip 43c is matched to one another.

A semiconductor device 45 is mounted almost in the center of the frame inside region 44d on the top surface 41a, and pads 45a of the semiconductor device 45 and the circuit strips 43a are connected through bonding wires 45b. A lid 46 is jointed onto the top of the frame 44 (hermetic sealing), and the frame inside region 44d on the dielectric substrate 41 is hermetically sealed thereby. A high-frequency package 40 of a microstrip line includes the dielectric substrate 41, ground 42, signal lines 43, frame 44, lid 46, and associated parts.

High-frequency signals are input from the lead strip 43b of the signal line 43 through the connecting strip 43c and circuit strip 43a thereof and reach the semiconductor device 45, while high-frequency signals emitted from the semiconductor device 45 are output from the lead strip 43b of the signal line 43 through the circuit strip 43a and connecting strip 43c thereof.

However, in the high-frequency package 40 having that construction, the width $w_1$ of the signal line 43 becomes narrow to $w_2$ in the connecting strip 43c. As a result, it is difficult to secure the dimensional precision of $w_2$, and the resistance increases in the connecting strip 43c, so that the insertion loss tends to be large. Moreover, in the manufacture thereof, it is difficult to accurately fit together both ends of the connecting strip 43c and the inner and outer surfaces 44b and 44c of the frame 44.

In order to cope with the problems, a high-frequency package has been proposed, wherein the portions of a frame, in which signal lines are buried, are formed to be thinner. FIG. 2 is a perspective view diagrammatically showing the principal part of a conventional high-frequency package of this type, and reference numerals 41 and 42 in the figure represent a dielectric substrate and a ground similar to those shown in FIG. 1. A ring-shaped frame 54 made of dielectrics is arranged in a prescribed place on the top surface 41a of the dielectric substrate 41, and an indented portion 54b is formed in a prescribed place of the frame 54 which a signal line 53 passes through. On the other hand, the thin-film-like signal line 53 having a width of $w_1$ is formed in a prescribed place on the top surface 41a of the dielectric substrate 41. One end portion 53a of the signal line 53 is formed in the inside region 54d of the frame 54, while the other end portion 53b of the signal line 53 is formed in the outside region 54e of the frame 54. The middle portion of the signal line 53 is located in the vicinity of the indented portion 54b of the frame 54.

Since the other constructions are almost the same as those shown in FIG. 1, no detailed descriptions thereof are given here. A high-frequency package includes these dielectric substrate 41, ground 42, signal lines 53, frame 54, and associated parts. High-frequency signals are input through the signal line 53 to a semiconductor device 45 (FIG. 1), while high-frequency signals emitted from the semiconductor device 45 are output through the signal line 53.

However, in the high-frequency package having that construction, the thickness $e_1$ of the indented portion 54b of the frame 54 need be set to be thin. This means that not only the manufacture thereof is difficult but the indented portion 54b thereof is especially low in strength.

In a high-frequency package of a microstrip line type shown in FIG. 1 or 2, when the semiconductor device 45 processes signals in a higher frequency band of such as millimeter or quasi-millimeter wavelengths, usually it causes a large connection loss of the semiconductor device 45 between the signal line 43 or 53, and a large radiation loss in the signal line 43 or 53 as well.

In order to cope with the problems, recently, a high-frequency package including a so-called coplanar line arrangement has been proposed, wherein signal lines and grounds are formed alongside next to each other on a dielectric substrate, and a semiconductor device 45 is mounted thereon in a flip-chip manner.

FIG. 3 is a perspective view partly in section diagrammatically showing the principal part of a conventional high-frequency package of this type (Japanese Kokai No. 02-87701), and in the figure, reference numeral 61 represents a metal substrate. A ceramic plate 63 is fixed on the metal substrate 61 in the shape of a rectangular parallelepiped board, and laminates 64 made by laminating, for example, three conductor layers 64a and three ceramic layers 64b alternately are attached in one piece on both left and right sides with the ceramic plate 63 between. A dielectric substrate 62 having an external shape of a rectangular parallelepiped board includes the ceramic plate 63, laminates 64, and associated parts. Thin-film-like signal lines 65 having a width of $w_1$ are formed in prescribed places on the dielectric substrate 62 in the back-and-forth direction of the arrow in the figure, and grounds 66 are formed on both left and right sides of the signal lines 65 with gaps g interposed between.

Ceramic walls 68 are formed on the middle portions of the signal lines 65 and the grounds 66 thereabout in the right-and-left direction of the arrow in the figure, and laminates 69 made by laminating, for example, two conductor layers 69a and three ceramic layers 69b alternately are formed in one piece on both end portions of the ceramic walls 68. A frame 67 almost in the shape of the symbol # includes these ceramic walls 68 and laminates 69. The metal substrate 61 and the grounds 66 in the vicinity of the signal line 65 in the inside region 67a of the frame 67 are vertically connected through each one of conductive vias 66a on both left and right sides of the signal lines 65.

A metalized layer 71 is formed on the top of the frame 67, the front ends 64c and 69c, and the right ends 64d and 69d of the laminates 64 and 69, or the like. A high-frequency package of a coplanar line includes these dielectric substrate 62, signal lines 65, grounds 66, frame 67, metalized layer 71, and associated parts.

In the high-frequency package having that construction, a semiconductor device (not shown) is mounted in the inside region 67a of the frame 67. The signal lines 65, which are surrounded by the grounds 66, conductors 64a and 69a, metalized layer 71, and metal substrate 61, are electromagnetically shielded thereby. And the ring resonance of the signal lines 65 or the like is restricted by the laminates 64 and 69, or the like, so that it is possible to enhance the high-frequency characteristic in the band of quasi-millimeter wavelengths (30 GHz frequency or less).

However, in the high-frequency package of a coplanar line shown in FIG. 3, there likely to be a problem of an inferior high-frequency characteristic in the band exceeding 30 GHz frequency (quasi-millimeter wavelength band). It is difficult to reduce the thickness $e_0$ of the ceramic wall 68, and it seems costly to manufacture the dielectric substrate 62 and the frame 67 having complicated constructions including the ceramic plate 63 or ceramic wall 68, and the laminate 64 or 69.

SUMMARY OF THE INVENTION

The present invention was developed in order to solve the above problems, and it is an object of the present invention to provide a high-frequency package, having an excellent high-frequency characteristic in a band from quasi-millimeter wavelengths to 90 GHz frequency range and a favorably sealed construction and excellent strength thereof, in addition, which can be easily manufactured at a competitive cost.

In order to achieve the above object, a high-frequency package (1) according to the present invention is characterized by having a ring-shaped frame, first and second signal lines being formed so as to face each other with the ring-shaped frame between in the inside and outside regions separated by the ring-shaped frame, and first and second grounds being formed around the first and second signal lines with gaps interposed between in the same plane, respectively, on one main surface side of a dielectric substrate;

having third signal lines, and a third ground being formed around the third signal lines with gaps interposed between in the same plane on the other main surface side of the dielectric substrate;

wherein first conductive vias for vertically connecting each of one end portions of the first and second signal lines with both end portions of the third signal line are formed; and a plurality of second conductive vias for vertically connecting the first and second grounds with the third ground are formed at prescribed intervals on both sides with the first to third signal lines between.

Here, the ring-shaped frame and the first and second grounds are conducting and it is desirable that both of the potentials thereof be zero.

In the high-frequency package (1), a signal interconnection in sequence including the first signal line, first conductive via, third signal line, first conductive via, and second signal line, can be easily formed not in contact with the frame, while a ground interconnection in sequence including the first ground, second conductive vias, third ground, second conductive vias, and second ground, can be easily formed. And a coplanar line including the ground interconnection and the signal interconnection can be formed.

The second conductive vias make it possible to reduce fluctuations in impedance based on the first conductive vias, resulting in a smaller return loss, while the electromagnetic waves emitted from the signal interconnection portion can be prevented from radiating into the dielectric substrate portion. As a result, the high-frequency characteristic in a band from quasi-millimeter to millimeter wavelengths can be excellent. Since the signal interconnection is kept from contact with the frame, it is possible to make the frame of a metal, which has the capability of electromagnetic shielding, leading to reliable sealing. As a result, a ground earth can be sufficiently established with the grounds, the ring-shaped frame, a lid, and associated parts, so that the stable transmission of high-frequency signals can be realized cost-effectively.

A high-frequency package (2) according to the present invention is characterized by setting a prescribed interval D between the second conductive vias within the range of $$D < \lambda/(2 \times \epsilon_r^{1/2}),$$

Where $\epsilon_r$ is the dielectric constant of the dielectric substrate, and $\lambda$ is the wavelength in the air of a high-frequency signal propagating through the first to third signal lines and first conductive vias.

Here, it is more favorable to make the lowest limit of the interval D as small as possible, but it is necessarily limited by the technique of forming the second conductive vias closer to each other on the dielectric substrate.

Using the high-frequency package (2), it is possible to prevent the high-frequency signals, emitted either from the first to third signal lines or first conductive vias in a direction perpendicular to the layers including the first to third signal lines, from leaking to the dielectric substrate portion through the narrower intervals D between the second conductive vias, so as to prevent the generation of ripples which seemingly is caused by the undesired mode originating in the wider intervals D. As a result, an excellent high-frequency characteristic in a high-frequency region of shorter wavelengths can be obtained.

A high-frequency package (3) according to the present invention is characterized by setting distances W between the first to third signal lines and the second conductive vias within the range of $$W < \lambda/(4 \times \epsilon_r^{1/2}),$$

Where
$\epsilon_r$ is the dielectric constant of the dielectric substrate, and
$\lambda$ is the wavelength in the air of a high-frequency signal propagating through the first to third signal lines and first conductive vias in the high-frequency package (1) or (2).

Here, since the ripple generated by resonance has a certain band, in practice, it is desirable to estimate the distance W by substituting for $\lambda$ the wavelength equivalent to 1.15 times the wavelength that corresponds to the frequency of a high-frequency signal to be actually utilized.

It is more favorable to make the lowest limit of the distance W as small as possible, but it is necessarily limited by the widths of the first to third signal lines, the gaps, the diameter of the second conductive vias, or the like.

Using the high-frequency package (3), it is possible to prevent the occurrence of resonance originating in the distance W up to the second conductive via in the high-frequency signals, emitted either from the first to third signal lines or first conductive vias almost in a direction perpendicular to the layers including the first to third signal lines, and to prevent the generation of ripples. When the package (2) with the distance W set above is assumed to be used for a high-frequency package, its characteristic in a high-frequency band of much shorter wavelengths will be excellent due to a synergistic effect of the W and D.

A high-frequency package (4) according to the present invention is characterized by arranging the second conductive vias proximate to the first conductive vias on and/or outside arcs whose centers are the first conductive vias, having such a radius $W_s$ as makes the relationship $W_s > W$ hold,
where $W_s$ is the distance between the center of the first conductive via and at least one of the second conductive vias proximate to the first conductive via, and
W are the distances between the second conductive vias, except the second conductive vias proximate to the first conductive vias, and the first to third signal lines in one of the high-frequency packages (1)–(3).

Here, when the distance $W_s$ becomes larger, the electromagnetic radiation occurs, so that the insertion loss tends to be increased. Therefore, the distance $W_s$ is desirably shorter than $\lambda/(2 \times \epsilon_r^{1/2})$, where $\epsilon_r$ is the dielectric constant of the dielectric substrate, and $\lambda$ is the wavelength in the air of a high-frequency signal propagating through the first to third signal lines and first conductive vias.

Using the high-frequency package (4), the generation of ripples can be prevented and the return loss of signals to be transmitted through the first conductive vias can be reduced by the existence of the second conductive vias proximate to the first conductive vias. As a result, the insertion loss can be lowered.

A high-frequency package (5) according to the present invention is characterized by setting a distance L between the first conductive vias within the range of $$2 \times T < L < \lambda/(\epsilon_r^{1/2}),$$

where
$\epsilon_r$ is the dielectric constant of the dielectric substrate,
$\lambda$ is the wavelength in the air of a high-frequency signal propagating through the first to third signal lines and first conductive vias, and T is the thickness of the dielectric substrate in one of the high-frequency packages (1)–(4).

Here, since the ripple generated by resonance has a certain band, in practice, it is desirable to estimate the distance L by substituting for $\lambda$ the wavelength equivalent to 1.15 times the wavelength that corresponds to the frequency of a high-frequency signal to be actually utilized.

Using the high-frequency package (5), it is possible to prevent the occurrence of resonance which is inevitably caused by a longer distance L between the first conductive vias, so as to prevent the generation of ripples. And it is possible to restrict the interference of the electromagnetic field between the first conductive vias, which is inevitably caused by a shorter distance L, and it is also possible to restrict the generation of oscillations incident thereto. When the packages (2) and/or (3) with the distance L set above are used for a high-frequency package, their characteristic in a high-frequency region of still shorter wavelengths will be excellent due to a synergistic effect of the W, D and T.

A high-frequency package (6) according to the present invention is characterized by having a ring-shaped frame made of an insulating material,
first and second signal lines being formed so as to face each other with the ring-shaped frame between in the inside and outside regions separated by the ring-shaped frame, and
a first ground being formed around the first and second signal lines with gaps interposed between in the same plane on one main surface side of a dielectric substrate;
wherein at least one of the first and second signal lines is formed so as to partially lie under the ring-shaped frame;
having third signal lines, and
a second ground being formed around the third signal lines with gaps interposed between in the same plane on the other main surface side of the dielectric substrate;
wherein first conductive vias for vertically connecting each of one end portions of the first and second signal lines with both end portions of the third signal line are formed; and
a plurality of second conductive vias for vertically connecting the first ground with the second ground are formed at prescribed intervals on both sides with the first to third signal lines between.

In the high-frequency package (6), in addition to the effects described in the high-frequency package (1), the thickness of the ring-shaped frame can be set to be large, since at least one of the first and second signal lines may be formed so as to partially lie under the ring-shaped frame. Thus, the strength of the ring-shaped frame can be secured.

It is possible to form the ring-shaped frame made of an insulating material using the same kind of a ceramic as the constituent of a dielectric substrate. In this case, the formation of the ring-shaped frame and the dielectric substrate can be conducted in the same steps. The simplification of the manufacturing processes enables a reduction in cost.

A high-frequency package (7) according to the present invention is characterized by setting an interval D between the second conductive vias within the range of $$D < \lambda/(2 \times \epsilon_r^{1/2}),$$

Where
$\epsilon_r$ is the dielectric constant of the dielectric substrate, and
$\lambda$ is the wavelength in the air of a high-frequency signal propagating through the first to third signal lines and first conductive vias in the high-frequency package (6).

Using the high-frequency package (7), it is possible to prevent the high-frequency signals, emitted either from the first to third signal lines or first conductive vias in a direction perpendicular to the layers including the first to third signal lines from leaking to the dielectric substrate portion through the narrower intervals D between the second conductive vias, so as to prevent the generation of ripples which seemingly is caused by the undesired mode originating in the wider intervals D. As a result, an excellent high-frequency characteristic in a high-frequency region of shorter wavelengths can be obtained. Here, it is more favorable to make the lowest limit of the interval D as small as possible, but it is necessarily controlled by the technique of forming the second conductive vias closer to each other on the dielectric substrate.

A high-frequency package (8) according to the present invention is characterized by one main surface of the dielectric substrate except a semiconductor device mounting area and the vicinities of external input-output terminal portions, being covered with the ring-shaped frame of an insulating material in the high-frequency package (6) or (7).

Using the high-frequency package (8), the wall thickness of the ring-shaped frame made of an insulating material can be sufficiently large, so that a strength problem in the ring-shaped frame can be solved. By making the space for mounting a semiconductor device small, the cavity resonance can be suppressed.

A high-frequency package (9) according to the present invention is characterized by conductive vias for electromagnetic shielding, being formed in the interior of the ring-shaped frame made of an insulating material in one of the high-frequency packages (6)–(8).

In the case of the high-frequency package according to the present invention, it is possible to make the wall thickness of the ring-shaped frame of an insulating material sufficiently large. When the wall thickness of the ring-shaped frame of an insulating material is made sufficiently large, it is easy to form conductive vias for electromagnetic shielding in the interior of the ring-shaped frame. Since the conductive vias for such shielding are formed in the interior of the ring-shaped frame, the shielding effect on electromagnetic waves can be made still higher.

A high-frequency package (10) according to the present invention is characterized by a metalized layer, being formed on the top surface of the ring-shaped frame in one of the high-frequency packages (6)–(9).

In the high-frequency package (10), even if the ring-shaped frame comprises an insulator such as a ceramic, a lid made of Koval, invar, or the like can be easily jointed to the top of the ring-shaped frame.

A high-frequency package (11) according to the present invention is characterized by a plurality of semiconductor device mounting areas being formed on one main surface side of the dielectric substrate, while a plurality of openings for semiconductor device mounting being correspondingly formed in the ring-shaped frame, as a whole which is convertible to multichip module (MCM) packages in one of the high-frequency packages (6)–(10).

Using the high-frequency package (11), the conversion to MCM packages can be easily carried out as each kind of electronic element comes to meet the requirements of higher levels of function.

BRIEF DESCRIPTION OF THE DRAWINGS

FIG. 1a is a sectional side view, while FIG. 1b is a sectional perspective view along line B—B of FIG. 1a;

FIG. 5 comprise enlarged diagrammatic views showing the principal part of a high-frequency package according to the embodiment (1), wherein

FIG. 8 comprise enlarged diagrammatic views showing the principal part of a high-frequency package according to the embodiment (3), wherein

FIG. 11 comprise graphs indicating the measurement results of a high-frequency package according to Example 1 using a network analyzer, wherein

FIG. 12 comprise graphs indicating the measurement results of a high-frequency package according to Example 2 using the network analyzer, wherein

FIG. 13 comprise graphs indicating the measurement results of a high-frequency package according to Example 3 using the network analyzer, wherein

FIG. 14 comprise graphs indicating the measurement results of a high-frequency package according to Example 4 using the network analyzer, wherein

FIG. 15 comprise graphs indicating the measurement results of a high-frequency package according to Comparative Example 1 using the network analyzer, wherein

FIG. 16 comprise graphs indicating the measurement results of a high-frequency package according to Comparative Example 2 using the network analyzer, wherein

FIG. 17 comprise graphs indicating the measurement results of a high-frequency package according to Example 5 using the network analyzer, wherein

FIG. 18 comprise graphs indicating the measurement results of a high-frequency package according to Example 6 using the network analyzer, wherein

FIG. 19 comprise graphs indicating the measurement results of a high-frequency package according to Comparative Example 3 using the network analyzer, wherein FIG. 20 comprise graphs indicating the measurement results of a high-frequency package according to Comparative Example 4 using the network analyzer, wherein

DETAILED DESCRIPTION OF THE PREFERRED EMBODIMENTS

The preferred embodiments of the high-frequency package according to the present invention are described below by reference to those Figures. Here, the same marks are affixed to component parts having the same functions as conventional ones.

Figure 4:
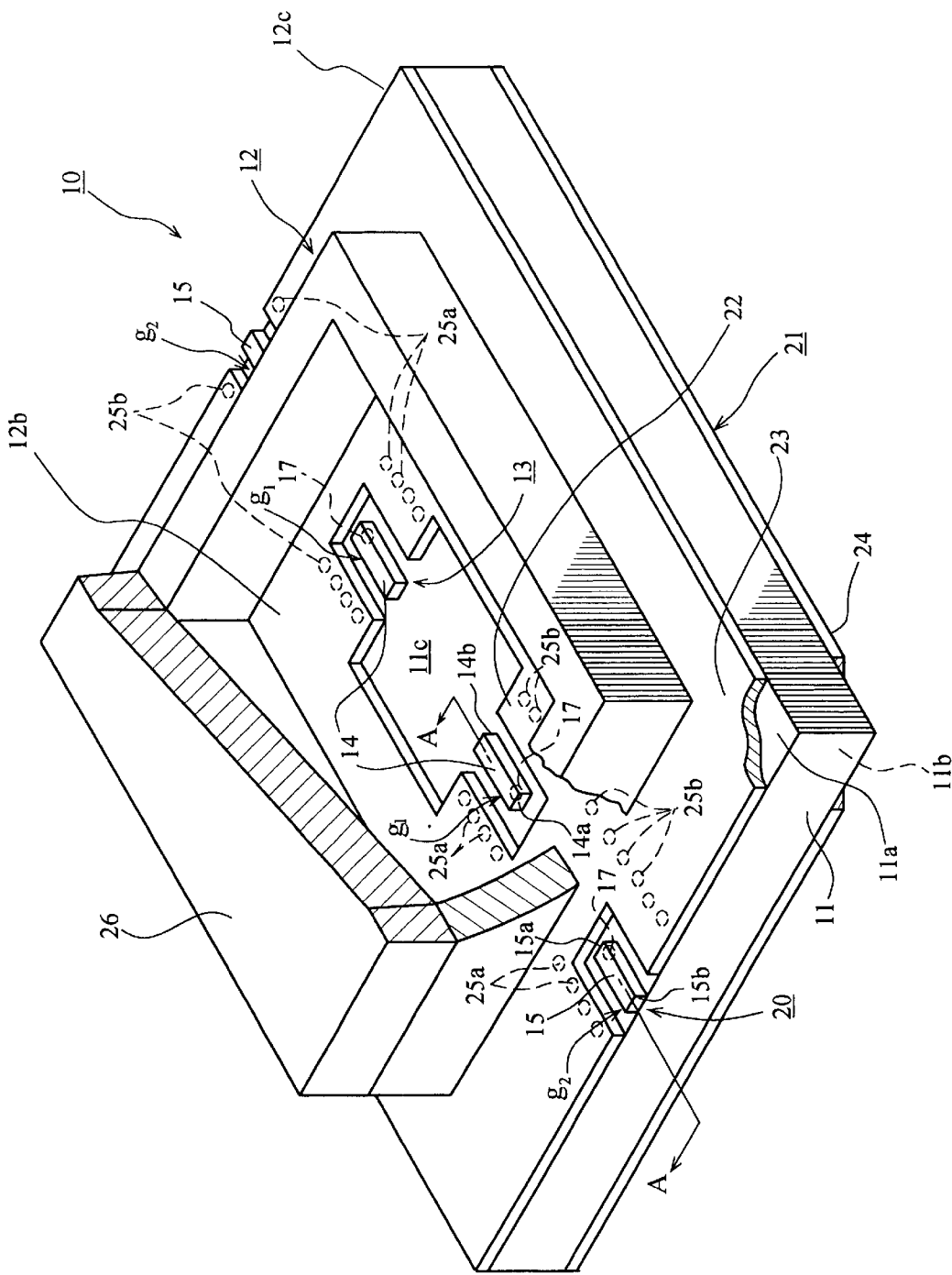
FIG. 4 is a perspective view partly in section diagrammatically showing a high-frequency package according to an embodiment (1) of the present invention.
Figure 5A:
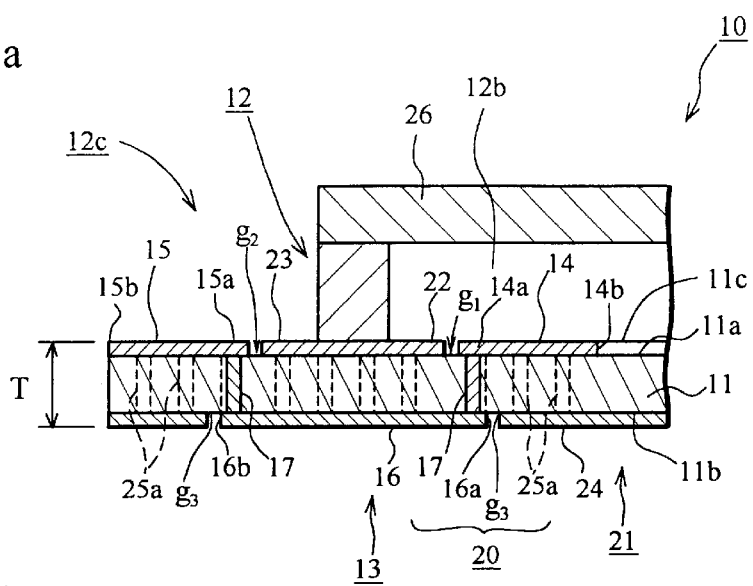
FIG. 5a is a sectional view along line A—A of FIG. 4.
Figure 5B:
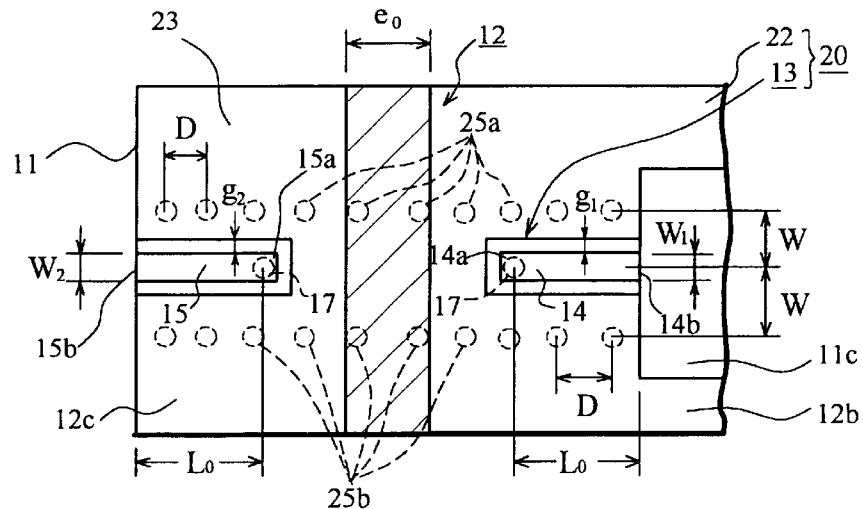
FIG. 5b is a plan view.
Figure 5C:
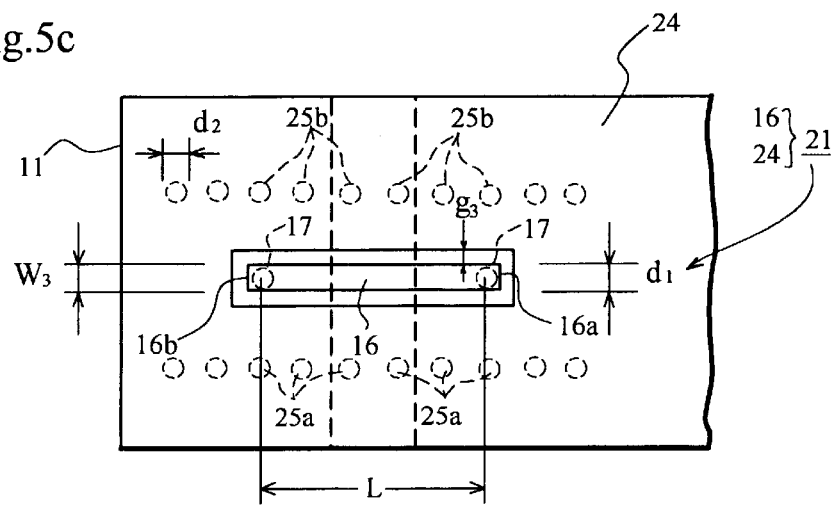
FIG. 5c is a bottom plan view.

FIG. 4 is a perspective view partly in section diagrammatically showing a high-frequency package according to an embodiment (1). FIG. 5 comprise enlarged diagrammatic views showing the principal part of a high-frequency package according to the embodiment (1), wherein FIG. 5a is a sectional view along line A—A of FIG. 4, FIG. 5b is a plan view, and FIG. 5c is a bottom plan view. A dielectric substrate 11 is made of an alumina ceramic or the like in the shape of a rectangular parallelepiped board having a thickness T. A frame 12 almost in the shape of a ring is arranged in a prescribed place on the top surface 11a of the dielectric substrate 11. The frame 12 is made of Koval or invar having almost the same coefficient of expansion as that of the dielectric substrate 11, and the thickness thereof is set to be $e_0$.

A space 11c for mounting a semiconductor device (not shown) is formed almost in the center of the frame inside region 12b. Belt-shaped signal lines 14 having a width of $w_1$ are formed respectively in prescribed places facing each other with the space 11c between on the top surface 11a, while belt-shaped signal lines 15 having a width of $w_2$ are formed in the places facing the signal lines 14 with the frame 12 between in the frame outside region 12c. Grounds 22 and 23 are formed in one piece around the signal lines 14 and 15 with gaps $g_1$ and $g_2$ interposed between. They constitute a coplanar line 20.

On the other hand, belt-shaped signal lines 16 having a width of $w_3$ are formed so as to cross the frame 12 in prescribed places on the bottom surface 11b of the dielectric substrate 11. A ground 24 is formed around the signal lines 16 with gaps $g_3$ interposed between. A coplanar line 21 comprises them.

The upper end portions of conductive vias 17 are connected to the end portions 14a and 15a of the signal lines 14 and 15, respectively, while the lower end portions of the conductive vias 17 are connected to both end portions 16a and 16b of the signal line 16, respectively. The diameter of the conductive via 17 is set to be $d_1$, the distance between the conductive via 17 and the end portion 14b or 15b of the signal line 14 or 15 is set to be $L_0$, and the distance between the conductive vias 17 is set to be L, respectively.

The distance L is set within the range of $2 \times T < L < \lambda/(\epsilon_r^{1/2})$, where $\epsilon_r$ is the dielectric constant of the dielectric substrate 11, $\lambda$ is the wavelength in the air of a high-frequency signal propagating through a signal interconnection 13 including the signal line 14, conductive via 17, signal line 16, conductive via 17, and signal line 15, and T is the thickness of the dielectric substrate 11. Here, since the ripple generated by resonance has a certain band, in practice, it is desirable to estimate the distance L by substituting for $\lambda$ the wavelength equivalent to 1.15 times the wavelength that corresponds to the frequency of a high-frequency signal to be actually utilized.

Conductive vias 25a and 25b, having a diameter of $d_2$, for connecting the grounds 22 and 23 with the ground 24 are formed on both sides with the signal lines 14, 15, and 16 between, respectively. The interval D between the conductive vias 25a and 25a, or 25b and 25b is set within the range of $D < \lambda/(2 \times \epsilon_r^{1/2})$, where $\epsilon_r$ is the dielectric constant of the dielectric substrate 11, and $\lambda$ is the wavelength in the air of a high-frequency signal propagating through the signal interconnection 13. It is more favorable to make the lowest limit of the interval D as small as possible, but it is necessarily limited by the technique of forming the conductive vias 25a or 25b closer to each other on the dielectric substrate 11.

The distance W between the center of the conductive via 25a or 25b, and the center line of the signal line 14, 15, or 16 is set within the range of $W < \lambda/(4 \times \epsilon_r^{1/2})$, where $\epsilon_r$ is the dielectric constant of the dielectric substrate 11, and $\lambda$ is the wavelength in the air of a high-frequency signal propagating through the signal interconnection 13. Also in this case, since the ripple generated by resonance has a certain band of some width, in practice, it is desirable to estimate the distance W by substituting for $\lambda$ the wavelength equivalent to 1.15 times the wavelength that corresponds to the frequency of a high-frequency signal to be actually utilized. It is more favorable to make the lowest limit of the distance W as small as possible, but actually, it is necessarily limited by the widths $w_1$, $w_2$, and $w_3$ of the signal lines 14, 15, and 16, the gaps $g_1$–$g_3$, the diameter $d_2$ of the conductive via 25a or 25b, or the like.

A lid 26 made of Koval or invar in the shape of a rectangular parallelepiped board is arranged on the frame 12. The lid 26 and the frame 12 are connected using soldering, brazing (both not shown), or the like. A high-frequency package 10 includes the dielectric substrate 11, the frame 12, a coplanar line 20, 21, the lid 26, a bias circuit not shown, and associated parts.

When the high-frequency package 10 having that construction is used, a high-frequency signal is input from the signal line end portion 15b through the signal interconnection 13 and signal line end portion 14b and reaches a semiconductor device, while being output from the signal line end portion 15b through the signal line end portion 14b and signal interconnection 13 from the semiconductor device.

When the interval D between the conductive vias 25a or 25b is set within the range of $D < \lambda/(2 \times \epsilon_r^{1/2})$, the high-frequency characteristic in a high-frequency region of still shorter wavelengths can be excellent due to a synergistic effect of the case where the distances W between the signal lines 14–16 and the conductive via 25a or 25b are set within the range of $W < \lambda/(4 \times \epsilon_r^{1/2})$.

In the high-frequency package 10 according to the embodiment (1), the case wherein the lid 26 is connected through a solder or the like to the frame 12 arranged on the dielectric substrate 11 for sealing, but in a high-frequency package according to another embodiment, a cap comprising the frame and lid being formed in one piece may be connected onto the dielectric substrate 11 for sealing.

In the high-frequency package 10 according to the embodiment (1), the case wherein the lower side of the dielectric substrate 11 is vacant, but in a high-frequency package according to another embodiment, another dielectric substrate may be laminated on the bottom surface 11b of the dielectric substrate 11. In this case, it is desirable to design again the width $w_3$ of the signal line 16 and the gap $g_3$ between the signal line 16 and the ground 24, in consideration of the value of the dielectric constant of another dielectric substrate to laminate.

Figure 6:
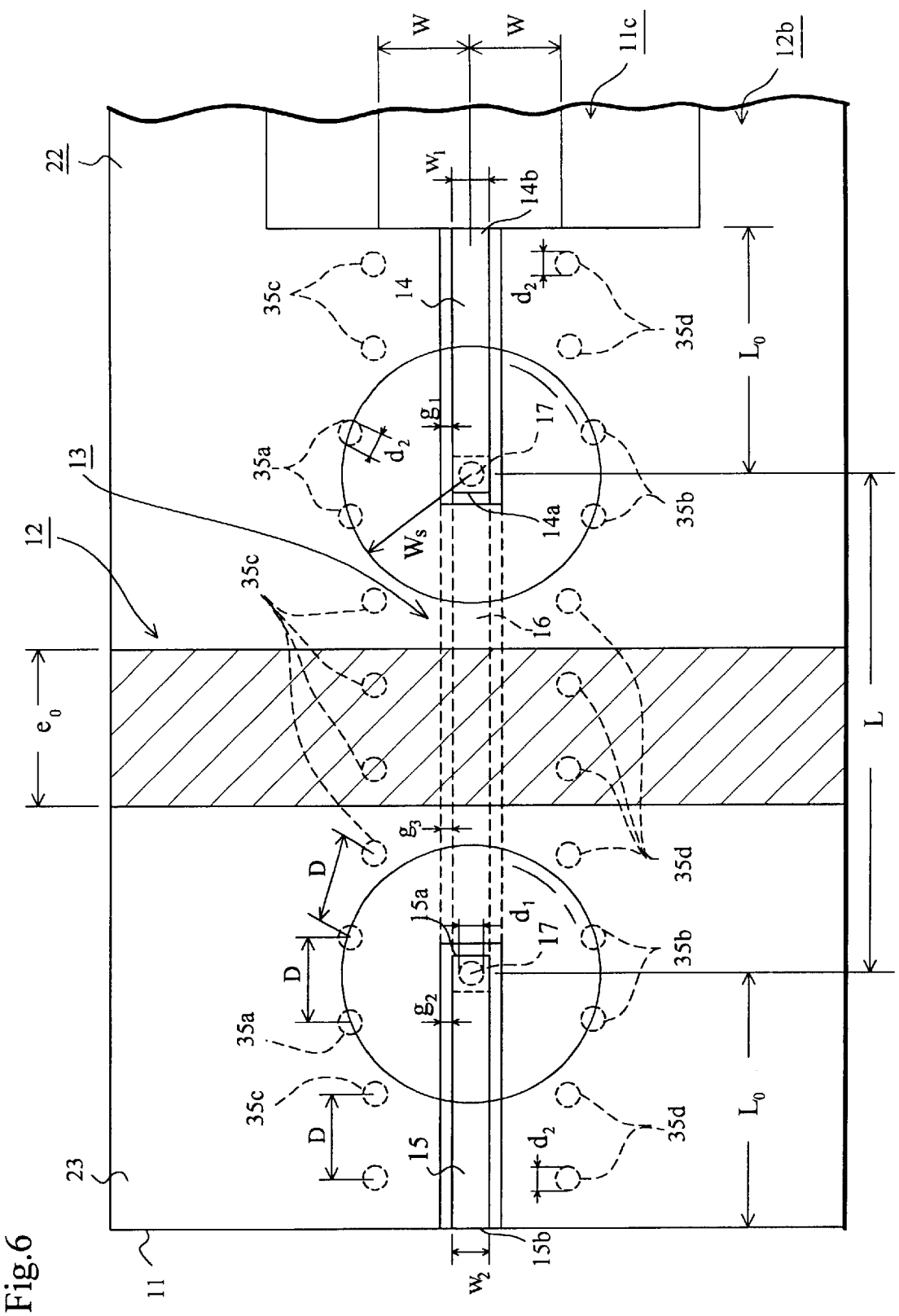
FIG. 6 is an enlarged plan view diagrammatically showing the principal part of a high-frequency package according to an embodiment (2)

FIG. 6 is an enlarged plan view diagrammatically showing the principal part of a high-frequency package according to an embodiment (2), and in the figure, reference numerals 14–16, and 17 represent signal lines and conductive vias similar to those shown in FIGS. 4 and 5, respectively. Each two conductive vias 35a and 35b having a diameter of $d_2$ are formed on arcs having a radius $W_s$ whose centers are the conductive vias 17 on both sides with the signal lines 14–16 between, respectively, and these conductive vias 35a and 35b vertically connect the grounds 22 and 23 with the ground 24 (FIGS. 4 and 5). A plurality of the conductive vias 35c and 35d having a diameter of $d_2$ for vertically connecting the grounds 22 and 23 with the ground 24 are formed respectively at prescribed intervals on both sides with the signal lines 14–16 between except within the circles having a radius $W_s$.

The distances W between the center of the conductive via 35c or 35d, and the center lines of the signal lines 14–16 are set within the range of $W<\lambda/(4\times\epsilon_r^{1/2})$, respectively, almost in the similar manner to those shown in FIGS. 4 and 5. Since the ripple generated by resonance has a certain band of some width, in practice, it is desirable to obtain the distance W by substituting for $\lambda$ the wavelength equivalent to 1.15 times the wavelength that corresponds to the frequency of a high-frequency signal to be actually utilized. It is more favorable to make the lowest limit of the distance W as small as possible, but actually, it is necessarily limited by the widths $w_1$, $w_2$, and $W_3$ of the signal lines 14, 15, and 16 (FIGS. 4 and 5), the gaps $g_1$–$g_3$, the diameter $d_2$ of the conductive via 35c or 35d, or the like.

On the other hand, the relationship of the distances $W_s$ and W is set to be $W_s>W$. When the distance $W_s$ is too large, the electromagnetic radiation occurs, so that the insertion loss tends to increase. Therefore, the radius $W_s$ is desirably smaller than $\lambda/(2\times\epsilon_r^{1/2})$, where $\epsilon_r$ is the dielectric constant of the dielectric substrate 11, and $\lambda$ is the wavelength in the air of a high-frequency signal propagating through the signal lines 14–16 and conductive vias 17.

The intervals D between the conductive vias 35a–35d are set within the range of $D<\lambda/(2\times\epsilon_r^{1/2})$. It is more favorable to make the lowest limit of the interval D as small as possible, but it is necessarily limited by the technique of forming the conductive vias 35a and 35c, or 35b and 35d closer to each other on the dielectric substrate 11.

Since the other constructions are almost similar to those shown in FIGS. 4 and 5, no detailed descriptions thereof are given here.

As is obvious from the above description, in the high-frequency package according to the embodiment (2), the conductive vias 35a or 35b proximate to the conductive vias 17 are arranged on the arcs whose centers are the conductive vias 17, having such a radius $W_s$ as makes the relationship $W_s>W$ hold, where the distances between the center of the conductive via 17 and each two conductive vias 35a and 35b proximate to the conductive via 17 are $W_s$ and the distances between the conductive vias 35c and 35d except the conductive vias 35a and 35b proximate to the conductive vias 17 and the signal lines 14–16 are W. Therefore, it is possible to prevent the generation of ripples, and by the conductive vias 35a and 35b proximate to the conductive vias 17, the return loss of the signal to be transmitted through the conductive vias 17 can be reduced. As a result, the insertion loss can be lowered.

Figure 7:
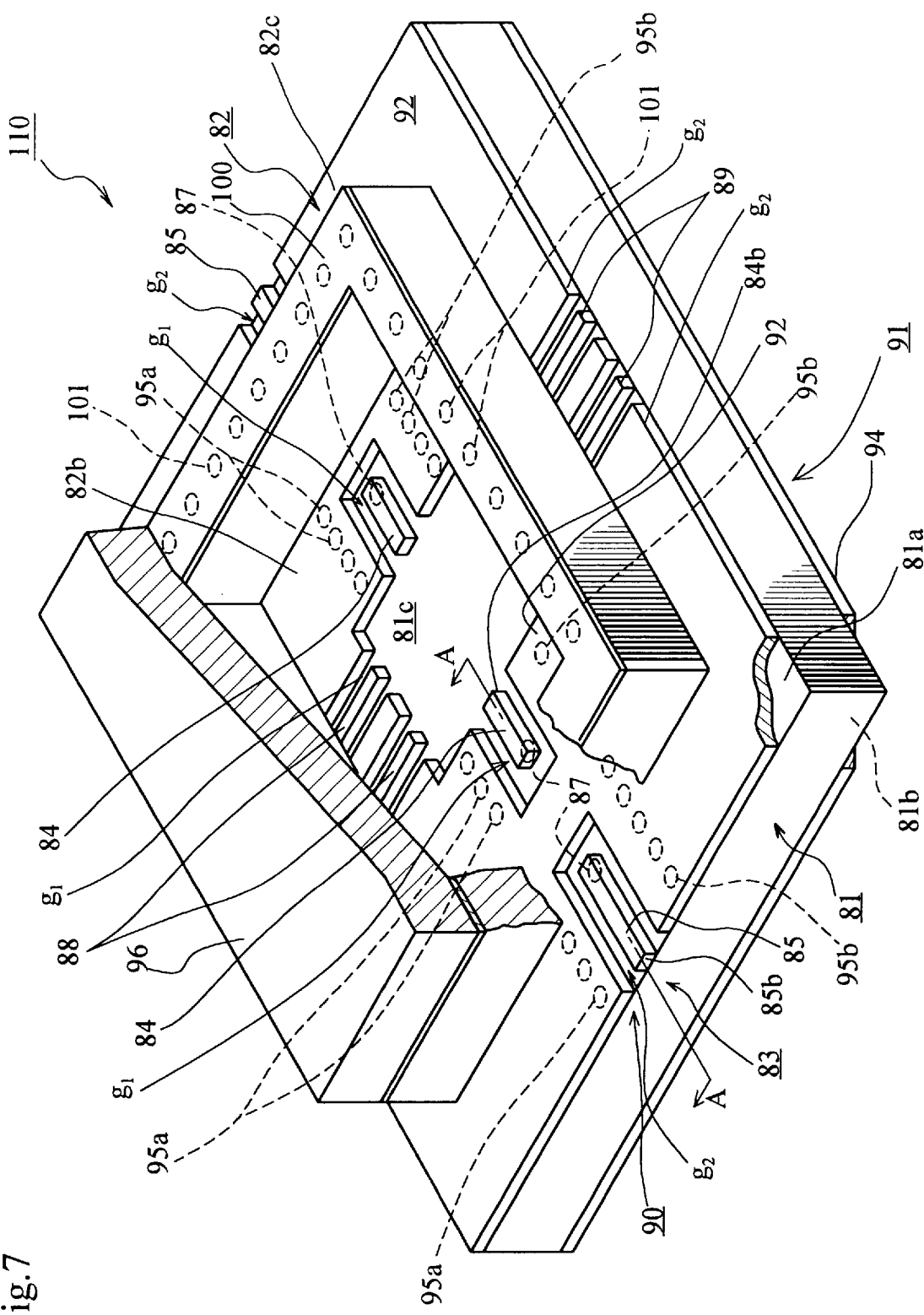
FIG. 7 is a perspective view partly in section diagrammatically showing a high-frequency package according to an embodiment (3)
Figure 8A:
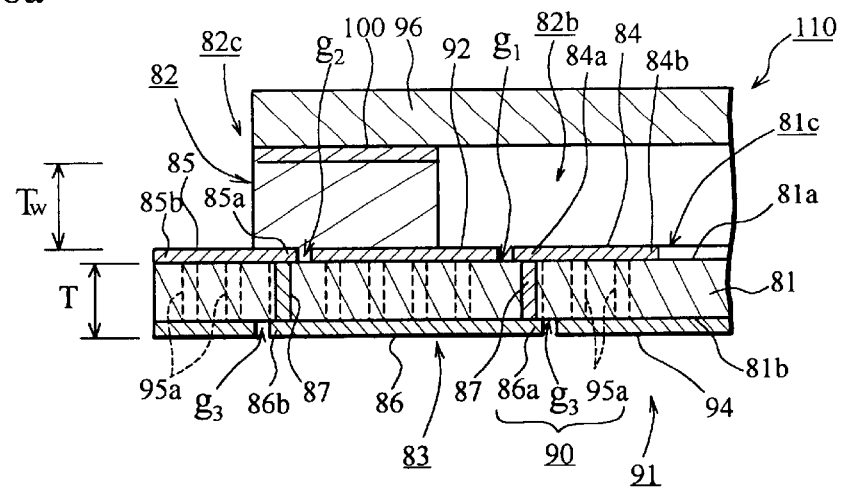
FIG. 8a is a sectional view along line A—A of FIG. 7.
Figure 8B:
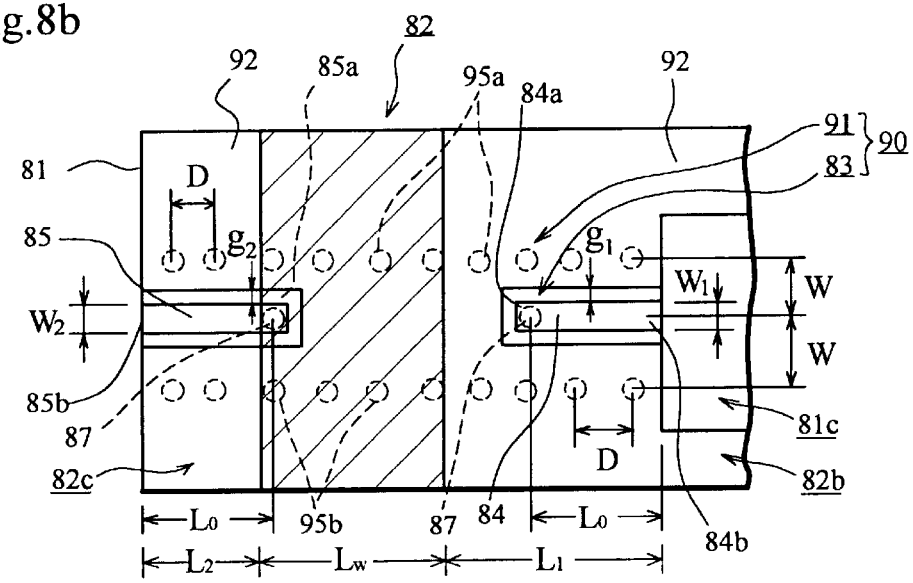
FIG. 8b is a plan view.
Figure 8C:
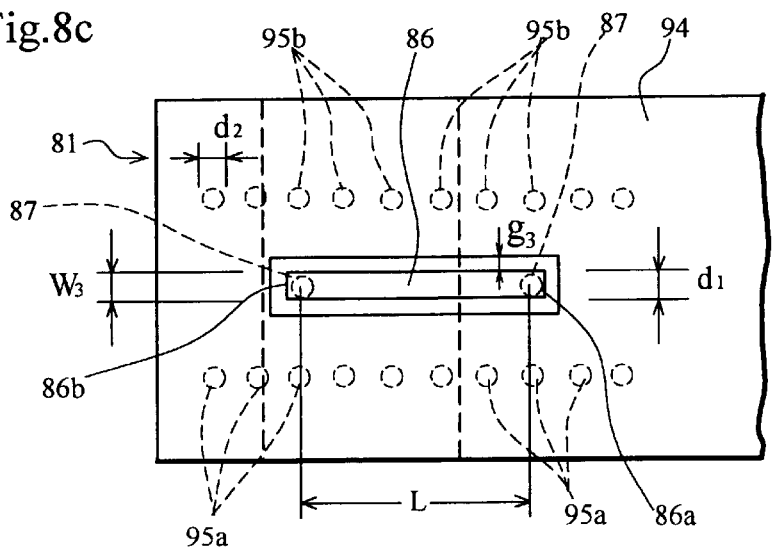
FIG. 8c is a bottom plan view.

FIG. 7 is a perspective view partly in section diagrammatically showing a high-frequency package according to an embodiment (3). FIGS. 8a, 8b, and 8c are enlarged diagrammatic views showing the principal part of a high-frequency package according to the embodiment (3). FIG. 8a is a sectional view along line A—A of FIG. 7, FIG. 8b is a plan view, and FIG. 8c is a bottom plan view.

A dielectric substrate 81 is formed using an alumina ceramic or the like in the shape of a rectangular parallelepiped board having a thickness T. A ring-shaped frame 82 made of an insulating material is placed in a prescribed place on the top surface 81a of the dielectric substrate 81. The ring-shaped frame 82 is formed using an alumina ceramic or the like in the similar manner to the dielectric substrate 81, and the thickness thereof is set to be $L_w$ (FIG. 8b).

A space 81c for mounting a semiconductor device (not shown) is formed almost in the center of the frame inside region 82b. Belt-shaped signal lines 84 having a width of $w_1$ are formed respectively in prescribed places facing each other with the space 81c between on the top surface 81a, while belt-shaped signal lines 85 having a width of $w_2$ are formed in the places facing the signal lines 84 with the ring-shaped frame 82 between in the frame outside region 82c. The ring-shaped frame 82 partially lies over at least one of the signal lines 84 and 85. A ground 92 is formed around the signal lines 84 and 85 with gaps $g_1$ and $g_2$ interposed between. They constitute a coplanar line.

On the other hand, belt-shaped signal lines 86 having a width of $w_3$ are formed so as to cross the frame 82 in prescribed places on the bottom surface 81b of the dielectric substrate 81 (FIG. 8c). A ground 94 is formed around the signal lines 86 with gaps $g_3$ interposed between. A coplanar line comprises them.

The upper end portions of conductive vias 87 are connected to the end portions 84a and 85a of the signal lines 84 and 85, respectively, while the lower end portions of the conductive vias 87 are connected to both end portions 86a and 86b of the signal line 86 (FIG. 8a). The diameter of the conductive via 87 is set to be $d_1$, the distance between the conductive via 87 and the end portion 84b or 85b of the signal line 84 or 85 is set to be $L_0$, and the distance between the conductive vias 87 is set to be L, respectively. The distance between the ring-shaped frame 82 and the end portion 84b of the signal line 84 is set to be $L_1$, the distance between the ring-shaped frame 82 and the end portion 85b of the signal line 85 is set to be $L_2$, the thickness of the ring-shaped frame 82 is set to be $L_w$, and the height thereof is set to be $T_w$, respectively.

The distance L is set within the range of $2\times T<L<\lambda/(\epsilon_r^{1/2})$, where $\epsilon_r$ is the dielectric constant of the dielectric substrate 81, $\lambda$ is the wavelength in the air of a high-frequency signal propagating through a signal interconnection 83 comprising the signal line 84, conductive via 87, signal line 86, conductive via 87, and signal line 85, and T is the thickness of the dielectric substrate 81. Here, since the ripple generated by resonance has a certain band of some width, in practice, it is more desirable to estimate the distance L by using as $\lambda$ the wavelength equivalent to 1.15 times the wavelength that corresponds to the frequency of a high-frequency signal to be actually utilized.

Conductive vias 95a and 95b having a diameter of $d_2$ for connecting the ground 92 with the ground 94 are formed on both sides with the signal lines 84, 85, and 86 between, respectively. The interval between the conductive vias 95a and 95a, or 95b and 95b is set to be D. The interval D is set within the range of $D<\lambda/(2\times\epsilon_r^{1/2})$, where $\epsilon_r$ is the dielectric constant of the dielectric substrate 81, and $\lambda$ is the wavelength in the air of a high-frequency signal propagating through the signal interconnection 83. Here, it is more favorable to make the lowest limit of the interval D as small as possible, but it is necessarily limited by the technique of forming the conductive vias 95a or 95b closer to each other on the dielectric substrate 81.

The distances between the center of the conductive via 95a or 95b, and the center lines of the signal lines 84, 85, and 86 are set to be W, respectively. The distance W is set within the range of $W<\lambda/(4\times\epsilon_r^{1/2})$, where $\epsilon_r$ is the dielectric constant of the dielectric substrate 81, and $\lambda$ is the wavelength in the air of a high-frequency signal propagating through the signal interconnection 83. Here, since the ripple generated by resonance has a certain band, in practice, it is more desirable to obtain the distance W by using as $\lambda$ the wavelength equivalent to 1.15 times the wavelength that corresponds to the frequency of a high-frequency signal to be actually utilized.

It is more favorable to make the lowest limit of the distance W as small as possible, but actually, it is necessarily limited by the widths $w_1$, $w_2$, and $w_3$ of the signal lines 84, 85, and 86, the gaps $g_1$–$g_3$, the diameter $d_2$ of the conductive via 95a or 95b, or the like. A ground 91 includes these ground 92, conductive vias 95a and 95b, and ground 94. A coplanar line 90 includes the ground 91 and the signal interconnection 83. A semiconductor device not shown is mounted on the coplanar line 90 in the vicinity of the space 81c.

Each two belt-shaped bias power supply terminals 88 having a prescribed width are formed in prescribed places facing each other with the space 81c between on the top surface 81a (FIG. 7). Each two belt-shaped outer lead terminals 89 having a prescribed width are formed in the places facing the bias power supply terminals 88 with the ring-shaped frame 82 between in the outside region 82c (FIG. 7). The ground 92 is formed around the bias power supply terminals 88 and outer lead terminals 89 with the gaps $g_1$ and $g_2$ interposed between in the same plane.

On the other hand, belt-shaped connecting interconnections (not shown) having a prescribed width are formed so as to cross the ring-shaped frame 82 in prescribed places on the bottom surface 81b of the dielectric substrate 81, and the ground 94 is formed around the connecting interconnections with gaps (not shown) interposed between in the same plane. The bias power supply terminals 88 and outer lead terminals 89, and the connecting interconnections are connected through conductive vias (not shown) in the similar manner to the signal interconnection 83.

Figure 1A:
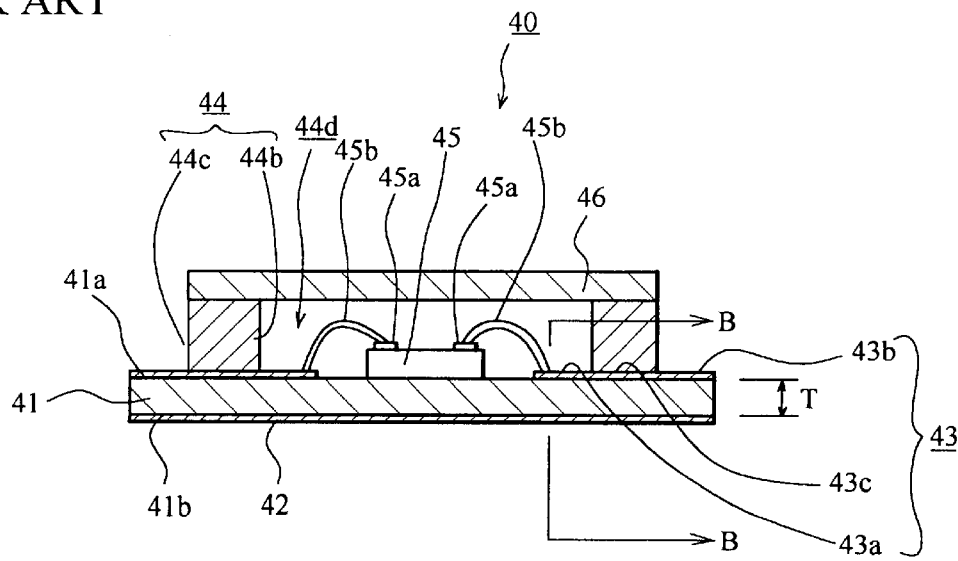
FIGS. 1a and 1b are schematic diagrams showing a conventional high-frequency package.
Figure 1B:
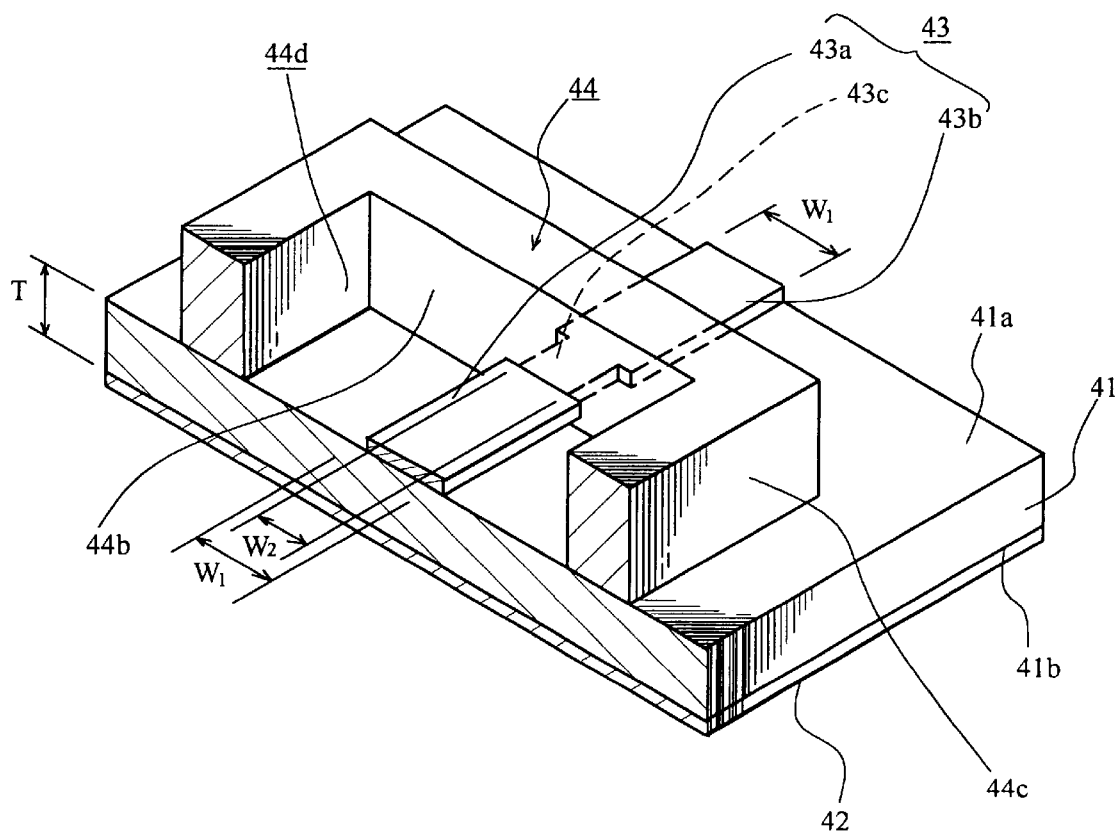
Figure 2:
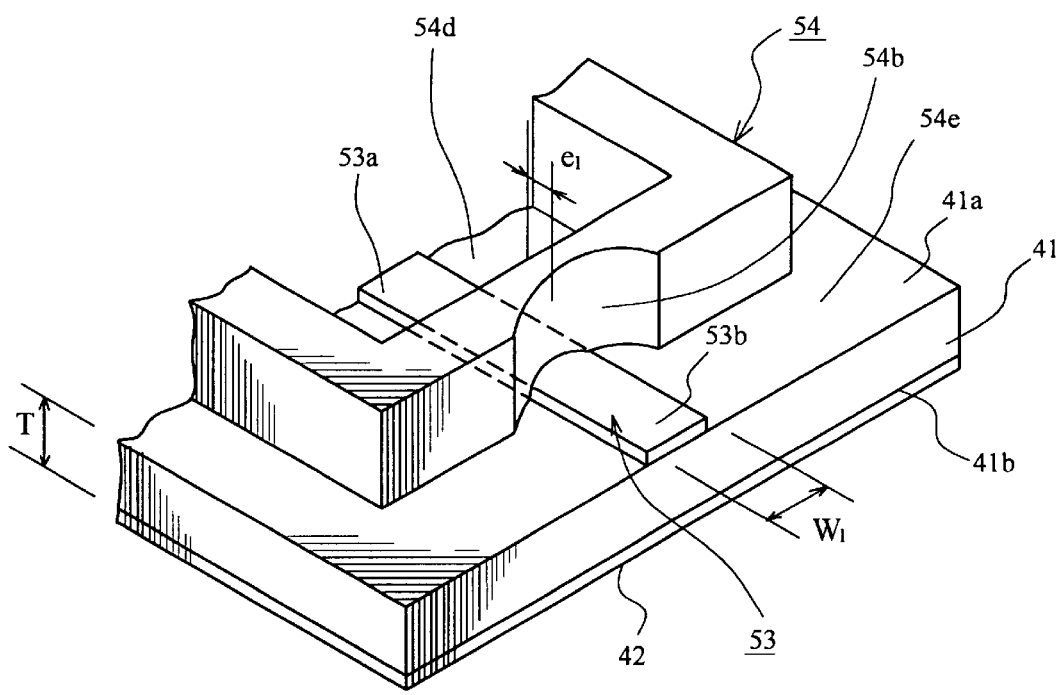
FIG. 2 is a perspective view diagrammatically showing the principal part of another conventional high-frequency package.
Figure 3:
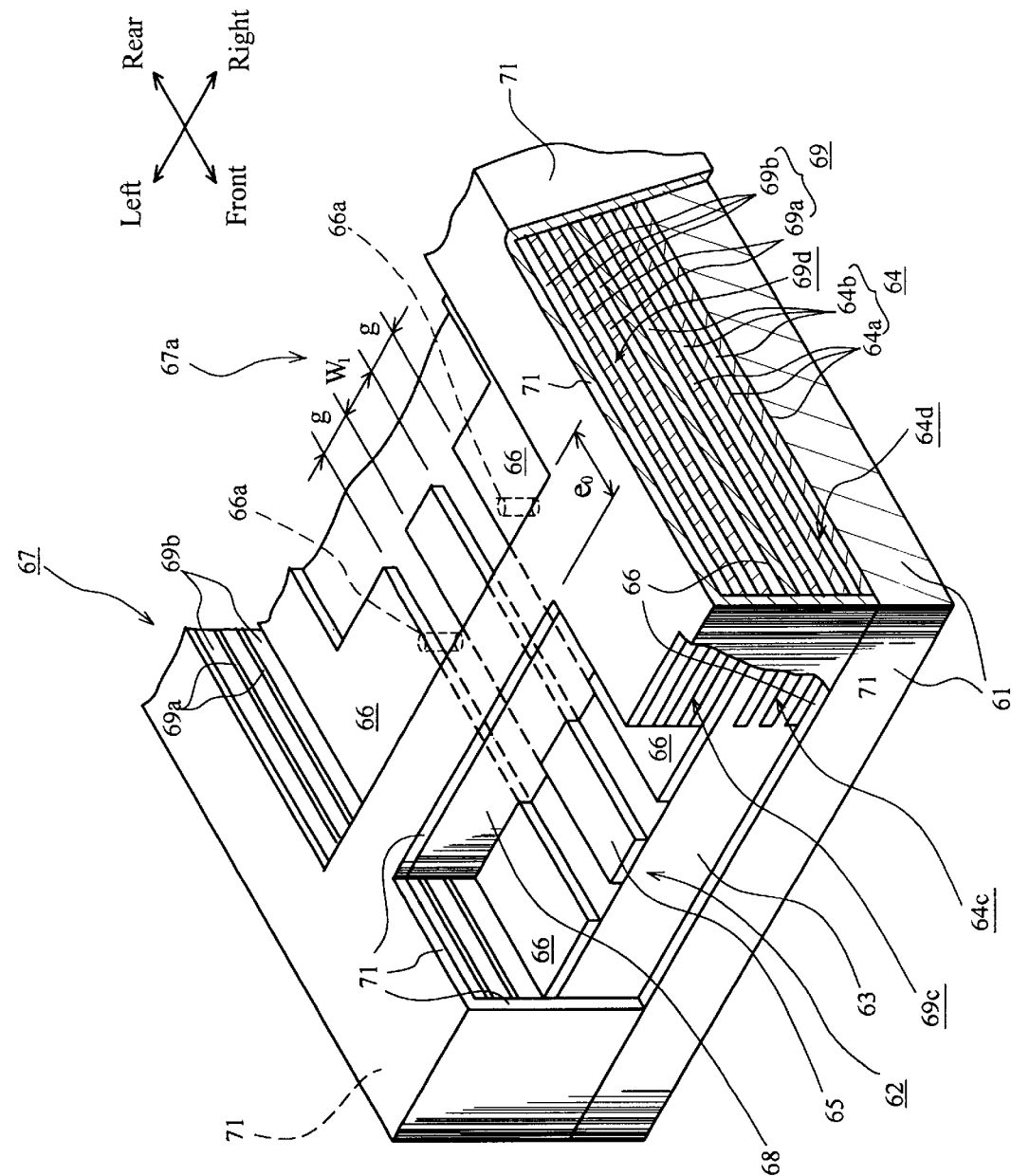
FIG. 3 is a perspective view partly in section diagrammatically showing the principal part of still another conventional high-frequency package.

The prescribed widths of the bias power supply terminal 88, outer lead terminal 89, and connecting interconnection, and the widths of the gaps $g_1$ and $g_2$, or the like need not be set similarly to the signal lines 84 and 85. The number of the bias power supply terminals 88 or outer lead terminals 89 may be three or four, as well as one. The construction of the bias line is not always required to be the above-described one using the bias power supply terminal 88, outer lead terminal 89, connecting interconnection, and conductive vias. It may be a coplanar line construction on the substrate main surface as shown in FIG. 3 (here, the frame need not have the laminate construction as shown in FIG. 3.). Or it may be a microstrip line construction as shown in FIG. 1 or 2 (here, it is not necessary to make the line width narrower or the wall thickness thinner as shown in FIG. 1 or 2.).

A metalized layer 100 is formed on the top of the ring-shaped frame 82. Therefore, even if the ring-shaped frame 82 comprises an insulator such as a ceramic, a lid 96 made of Koval or invar can be easily jointed onto the top of the frame 82. The lid 96 and the ring-shaped frame 82 are connected using a solder (not shown), or the like.

In a high-frequency package 110 according to the embodiment (3), since the ring-shaped frame 82 is formed so as to partially lie over at least one of the signal lines 84 and 85, the wall thickness $L_w$ of the ring-shaped frame 82 can be made sufficiently large. By making the wall thickness $L_w$ of the ring-shaped frame 82 sufficiently large, conductive vias 101 for shielding can be easily formed in the interior of the ring-shaped frame 82. A large number of conductive vias 101 for shielding which connect the ground 92 and the lid 96 are formed in the interior of the ring-shaped frame 82, so that the shielding effect on the electromagnetic waves can be further improved.

The high-frequency package 110 includes these dielectric substrate 81, ring-shaped frame 82, coplanar line 90, lid 96, and associated parts.

When the high-frequency package 110 having that construction is used, a high-frequency signal is input from the signal line end portion 85b through the signal interconnection 83 and signal line end portion 84b and reaches a semiconductor device, while the output signal, emitted from the semiconductor device, is output from the signal line end portion 85b through the signal line end portion 84b and signal interconnection 83.

As is obvious from the above description, in the high-frequency package 110 according to the embodiment (3), the ring-shaped frame 82, the signal lines 84 and 85 being formed so as to face each other with the ring-shaped frame 82 between in the inside and outside regions 82b and 82c separated by the ring-shaped frame 82, and the ground 92 being formed around the signal lines 84 and 85 with gaps $g_1$ and $g_2$ interposed between in the same plane, respectively, are included on one main surface 81a side of the dielectric substrate 81, while the signal lines 86 and the ground 94 being formed around the signal lines 86 with gaps $g_3$ interposed between in the same plane are included on the other main surface 81b side of the dielectric substrate 81.

The conductive vias 87 for connecting each of one end portions 84a and 85a of the signal lines 84 and 85 with both end portions 86a and 86b of the signal line 86 are included therein, while a plurality of conductive vias 95a and 95b for vertically connecting the ground 92 with the ground 94 are formed at prescribed intervals D on both sides with the signal lines 84–86 between. The signal interconnection 83 in sequence including the signal line 84, conductive via 87, signal line 86, conductive via 87, and signal line 85 can be easily formed only with the ring-shaped frame 82 partially lying thereon.

The ground 91 including the ground 92, conductive vias 95a and 95b, and ground 94 can be easily formed, and the coplanar line 90 including the ground 91 and signal interconnection 83 can be easily formed. A plurality of conductive vias 95a and 95b make it possible to reduce fluctuations in impedance based on the conductive vias 87, resulting in a smaller return loss, while the electromagnetic waves emitted from the signal interconnection 83 portion can be prevented from radiating into the dielectric substrate 81 portion. As a result, the high-frequency characteristic in a band from quasi-millimeter to millimeter wavelengths can be excellent.

Since the interval D between the conductive vias 95a and 95a, or 95b and 95b is set within the range of $D<\lambda/(2\times\epsilon_r^{1/2})$, where $\epsilon_r$ is the dielectric constant of the dielectric substrate 81, and $\lambda$ is the wavelength in the air of a high-frequency signal propagating through the signal interconnection 83, it is possible to prevent the high-frequency signals, emitted from the signal interconnection 83 in a direction perpendicular to the layers including the signal lines 84–86, from leaking to the dielectric substrate 81 portion through the narrower intervals D between the conductive vias 95a or 95b, so as to prevent the generation of ripples which seemingly is caused by the undesired mode originating in the wider intervals D. As a result, an excellent high-frequency characteristic in a high-frequency region of shorter wavelengths can be obtained.

When the interval D between the conductive vias 95a or 95b is set within the range of $D<\lambda/(2\times\epsilon_r^{1/2})$, an excellent high-frequency characteristic in a high-frequency region of still shorter wavelengths can be obtained due to a synergistic effect of the case where the distances W between the signal lines 84–86 and the conductive via 95a or 95b are set within the range of $W<\lambda/(4\times\epsilon_r^{1/2})$.

In the high-frequency package 110 according to the embodiment (3), the case wherein the ring-shaped frame 82 is made of an alumina ceramic or the like is described, but in a high-frequency package according to another embodiment, the ring-shaped frame may be formed using an insulating material having a lower dielectric constant. Using the high-frequency package, it is possible to restrict the radiation of the electromagnetic waves from the buried portions of the signal lines 85 and conductive vias 87 in the ring-shaped frame to the ring-shaped frame, resulting in a lower insertion loss.

Figure 9:
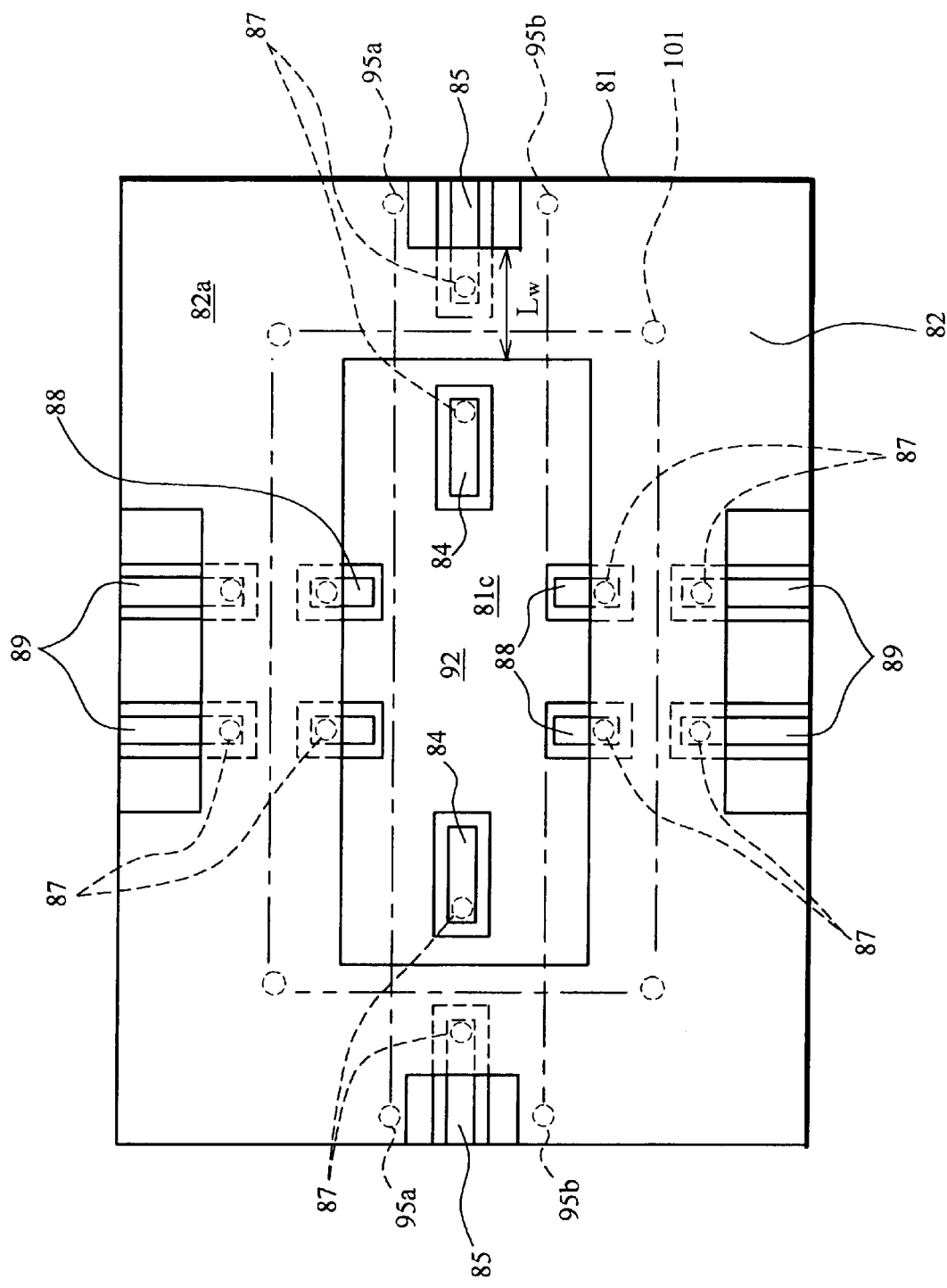
FIG. 9 is a diagrammatic plan view showing the principal part of a high-frequency package according to an embodiment (4)
Figure 10:
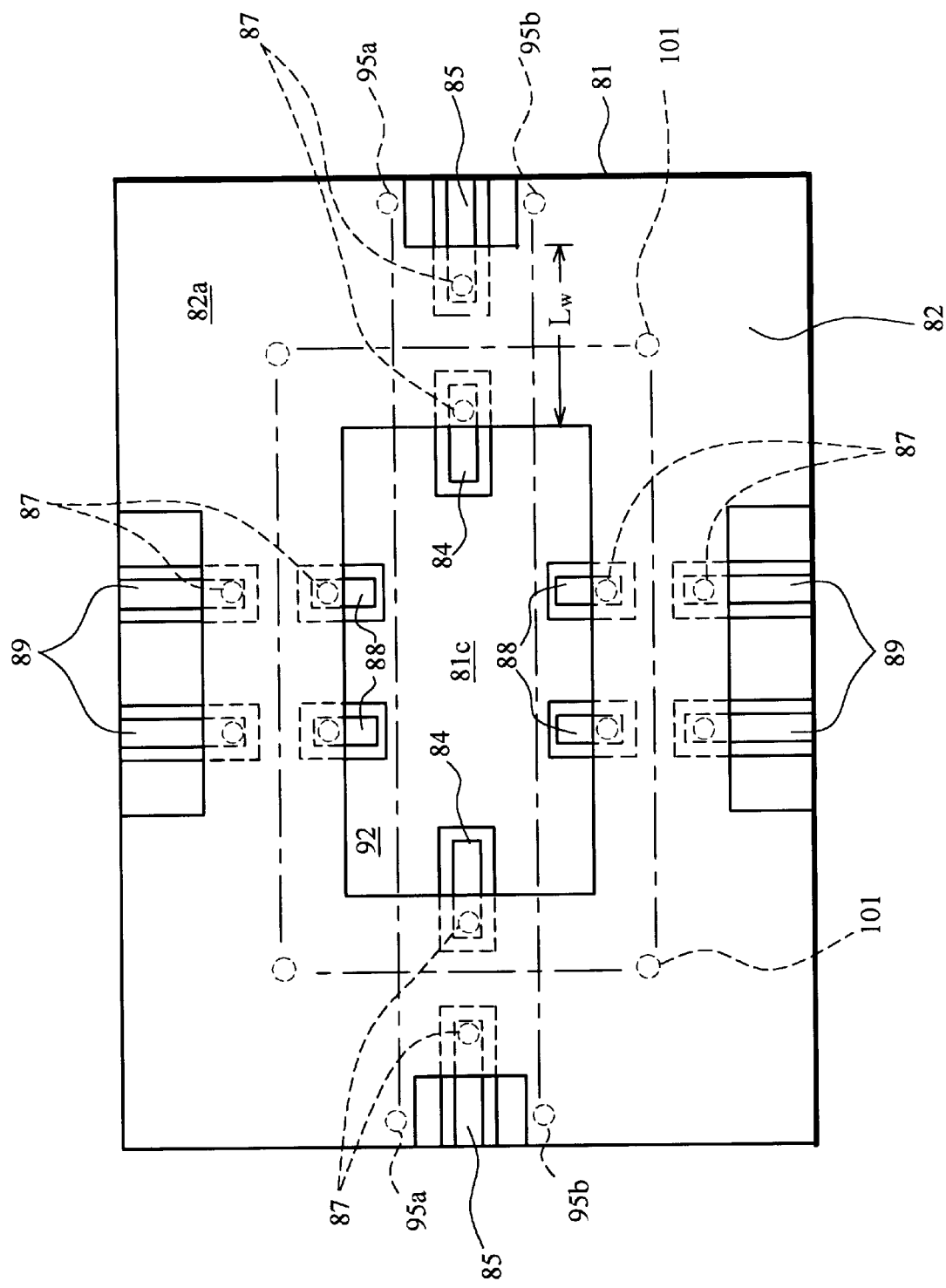
FIG. 10 is an enlarged plan view diagrammatically showing the principal part of a high-frequency package according to an embodiment (5)

In a high-frequency package according to another embodiment, as shown in FIG. 9 or 10, one main surface side of a dielectric substrate 81 except a semiconductor device mounting area and the vicinities of external input-output terminal portions may be buried under a ring-shaped frame 82 made of an insulating material. In the high-frequency package, the wall thickness $L_w$ of the ring-shaped frame can be sufficiently large, so that a strength problem in the ring-shaped frame can be solved.

A high-frequency package according to another embodiment may be constructed so that as a whole it is convertible to multichip module (MCM) packages, by forming a plurality of semiconductor device mounting areas on one main surface side of a dielectric substrate 81, and correspondingly forming a plurality of openings for semiconductor device mounting in a ring-shaped frame. Using the high-frequency package, it is easy to be converted to MCM packages as each kind of electronic element comes to meet the requirements of higher levels of function. In the case of the high-frequency package ready for conversion to MCM packages, it is needless to say that the construction as shown in line A—A portion of FIG. 7 is adopted as that of semiconductor devices and chips of each electronic component, or openings, wherein the insertion loss of high-frequency signals is a problem.

In the high-frequency package 110 according to the embodiment (3), the case wherein the lower side of the dielectric substrate 81 is vacant, but in a high-frequency package according to another embodiment, another dielectric substrate may be laminated on the bottom surface 81b of the dielectric substrate 81. In this case, it is desirable to design again the width $w_3$ of the signal line 86 and the gap $g_3$ between the signal line 86 and the ground 94, in consideration of the value of the dielectric constant of another dielectric substrate to laminate.

EXAMPLES

The results of insertion losses and return losses examined with the below-described experiment conditions using high-frequency packages according to Examples are described below.

The thickness T of a dielectric substrate 11, the dielectric constant $\epsilon_r$ thereof, the widths $w_1$–$w_3$ of signal lines 14–16, the distance $L_0$ between a conductive via 17 and the end portion 14b or 15b of the signal line 14 or 15, the gaps $g_1$–$g_3$ between the signal lines 14–16 and grounds 22–24, and the diameter $d_1$ of the conductive via 17 and the diameter $d_2$ of conductive vias 25a, 25b (both in FIG. 5), or 35a–35d (FIG. 6), in high-frequency packages according to Examples 1–4, and Comparative Examples 1 and 2, respectively, are shown in Table 1.

TABLE 1

| Item Unit | T mm | $\epsilon_r$ — | $w_1$ mm | $w_2$ mm | $w_3$ mm | $L_0$ mm | $g_1$ mm | $g_2$ mm | $g_3$ mm | $d_1$ mm | $d_2$ mm |
|---|---|---|---|---|---|---|---|---|---|---|---|
| Example 1 | 0.3 | 7.5 | 0.16 | 0.16 | 0.16 | 1.0 | 0.1 | 0.1 | 0.1 | 0.14 | 0.14 |
| Example 2 | 0.3 | 9.0 | 0.10 | 0.18 | 0.18 | 0.6 | 0.05 | 0.1 | 0.1 | 0.14 | 0.14 |
| Example 3 | 0.3 | 7.5 | 0.18 | 0.18 | 0.18 | 0.5 | 0.1 | 0.1 | 0.1 | 0.14 | 0.14 |
| Example 4 | 0.2 | 9.0 | 0.10 | 0.12 | 0.12 | 0.6 | 0.06 | 0.07 | 0.07 | 0.14 | 0.16 |
| Comparative Example 1 | 0.3 | 9.0 | 0.18 | 0.18 | 0.18 | 0.6 | 0.1 | 0.1 | 0.1 | 0.14 | — |
| Comparative Example 2 | 0.3 | 9.0 | 0.18 | 0.18 | 0.18 | 0.6 | 0.1 | 0.1 | 0.1 | 0.14 | 0.14 |

Note)
In Example 2, a conductive via 17 is connected through a land 0.18 mm square being formed in the end portion 14a of a signal line (both shown in FIG. 5).

The interval D between the conductive vias 25a and 25a, or 25b and 25b, or between the conductive vias 35a–35d and 35a–35d, respectively, the distance W between the signal lines 14, 15, or 16 and the conductive via 25a or 25b, or the conductive via 35c or 35d, the distance L between the conductive vias 17, and the distance $W_s$ between the conductive via 17 and the conductive via 35a or 35b, in the high-frequency packages according to Examples 1–4, and Comparative Examples 1 and 2, respectively, are shown in Table 2 (set point column).

Here, in Table 2, the normal values of the interval D, and the distances W, L, and $W_s$ of each high-frequency package according to Examples 1–4, and Comparative Examples 1 and 2, which are estimated, based on the thickness T of the dielectric substrate 11 and the wavelength $\lambda$ in the case where the high frequency to be utilized is 70 GHz (the value to substitute is 80 GHz), are respectively shown at the same time. Whether the set points satisfy the normal values or not is indicated by marking a circle or a cross.

TABLE 2

| Item | Reference GHz | λ (mm) | wavelength Normal value | Set point | Result | Normal value | Set point | Result | D (mm) Normal value | Set point | W (mm) Normal value | Result | L (mm) Normal value | Set point | Ws (mm) Result |
|---|---|---|---|---|---|---|---|---|---|---|---|---|---|---|---|
| Example 1 | 70 | 4.29 | 0.78> | 0.55 | ○ | | | | | | | | | | |
| | 80 | 3.75 | | | | 0.34> | 0.48 | X | 1.37> | 2.10 | >0.6 | X | | | |
| Example 2 | 70 | 4.29 | 0.71> | 0.50 | ○ | | | | | | | | | | |
| | 80 | 3.75 | | | | 0.31> | 0.34 | X | 1.25> | 1.15 | >0.6 | ○ | | | |
| Example 3 | 70 | 4.29 | 0.78> | 0.50 | ○ | | | | | | | | | | |
| | 80 | 3.75 | | | | 0.34> | 0.26 | ○ | 1.37> | 1.00 | >0.6 | ○ | | | |
| Example 4 | 70 | 4.29 | 0.72> | 0.40 | ○ | | | | | | | | | | |
| | 80 | 3.75 | | | | 0.31> | 0.34 | X | 1.25> | 1.15 | >0.4 | ○ | 0.34< | 0.52 | ○ |
| Comparative Example 1 | 70 | 4.29 | 0.71> | — | X | | | | | | | | | | |
| | 80 | 3.75 | | | | 0.31> | — | X | 1.25> | 1.05 | >0.6 | ○ | | | |
| Comparative Example 2 | 70 | 4.29 | 0.71> | 1.05 | X | | | | | | | | | | |
| | 80 | 3.75 | | | | 0.31> | 0.52 | X | 1.25> | 1.05 | >0.6 | ○ | | | |

As is obvious from Table 2, the interval D in Example 1, the interval D and distance L in Example 2, the interval D and distances W and L in Example 3, and the interval D and distances L and $W_s$ in Example 4, satisfy the normal values, respectively.

On the other hand, as Comparative Example 1, a high-frequency package wherein no conductive vias 25a and 25b were formed (here, only the distance L satisfied the normal value) was selected, while as Comparative Example 2, there selected a high-frequency package wherein the conductive vias 25a and 25b were formed on both sides of a signal lines 16 only on the lower surface in the vicinities of conductive vias 17, not on both sides of signal lines 14 and 15 on the upper surface (here, only the distance L satisfied the normal value).

As a test apparatus, a network analyzer was used. The insertion losses $S_{21}$ and return losses $S_{11}$ of the high-frequency packages according to Examples 11–14, and Comparative Examples 1 and 2 were measured with a lid 26 (FIG. 5) removed, using an air coplanar probe having a ground signal ground pitch of 0.25 mm.

Figure 15A:
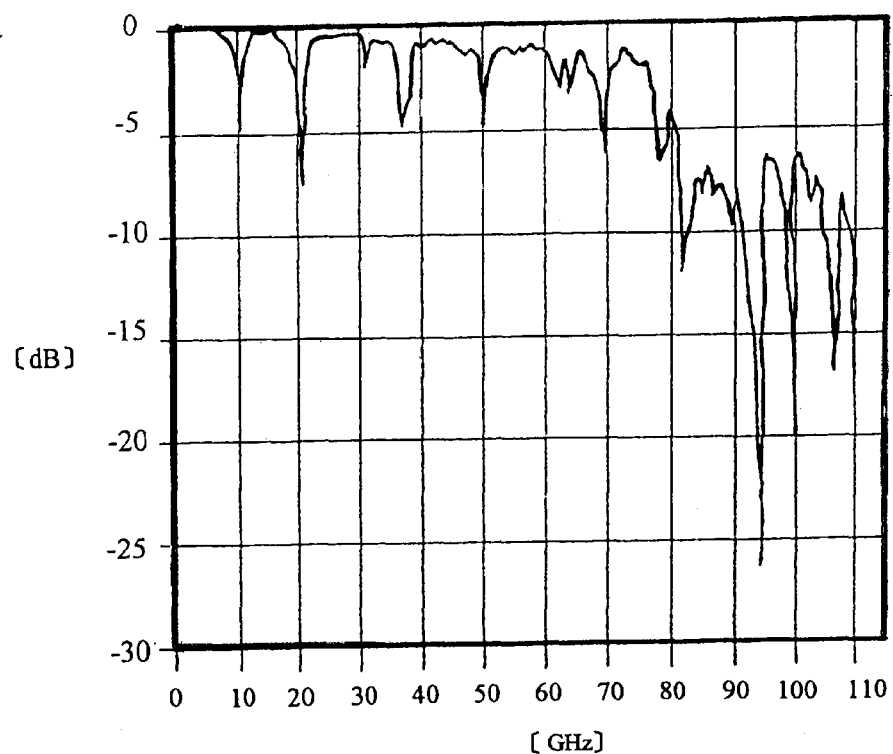
FIG. 15a shows the insertion loss and FIG. 15b shows the return loss.
Figure 15B:
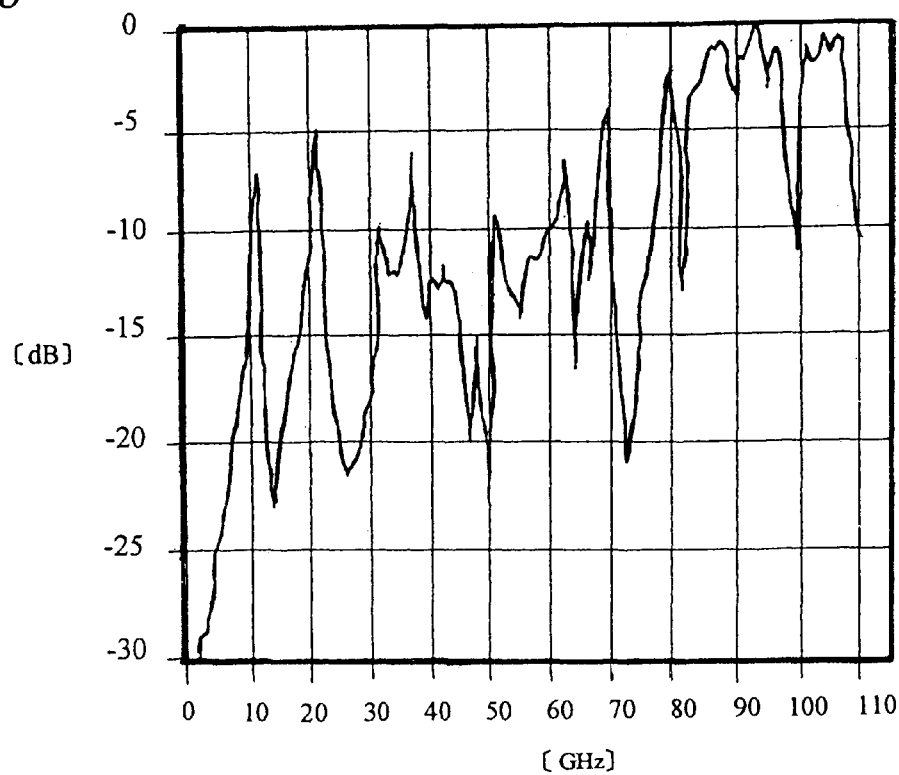
Figure 16A:
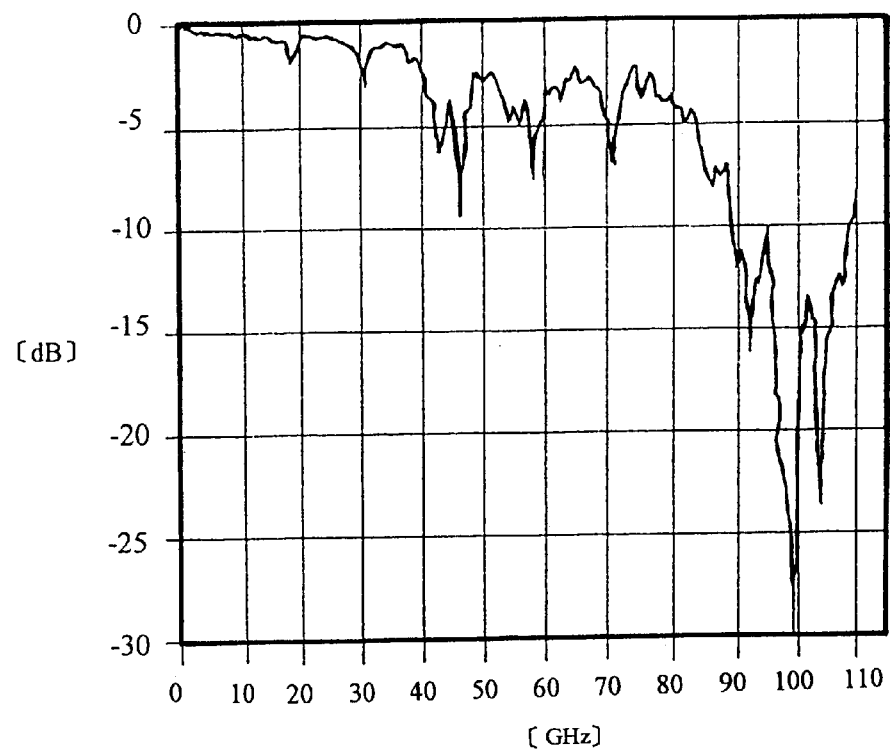
FIG. 16a shows the insertion loss and FIG. 16b shows the return loss.
Figure 16B:
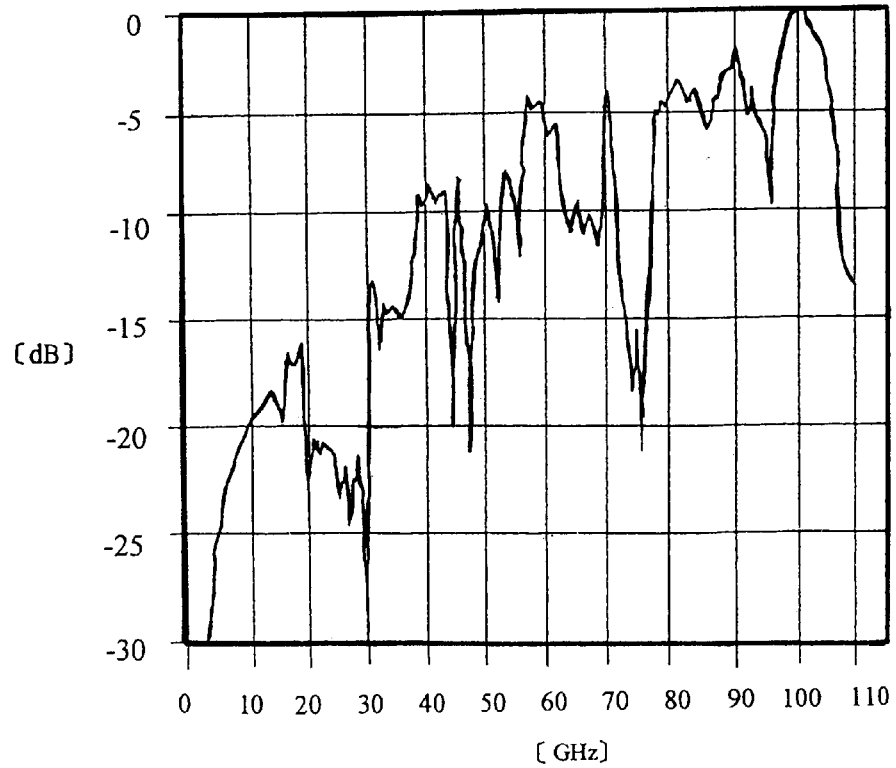

FIGS. 11–14 are graphs indicating the measurement results of the high-frequency packages according to Examples 11–14, using the network analyzer. Figures a show the insertion losses, while figures b show the return losses. FIGS. 15 and 16 are graphs indicating the measurement results of the high-frequency packages according to Comparative Examples 1 and 2, using the network analyzer. Figures a show the insertion losses, while figures b show the return losses.

Figure 11A:
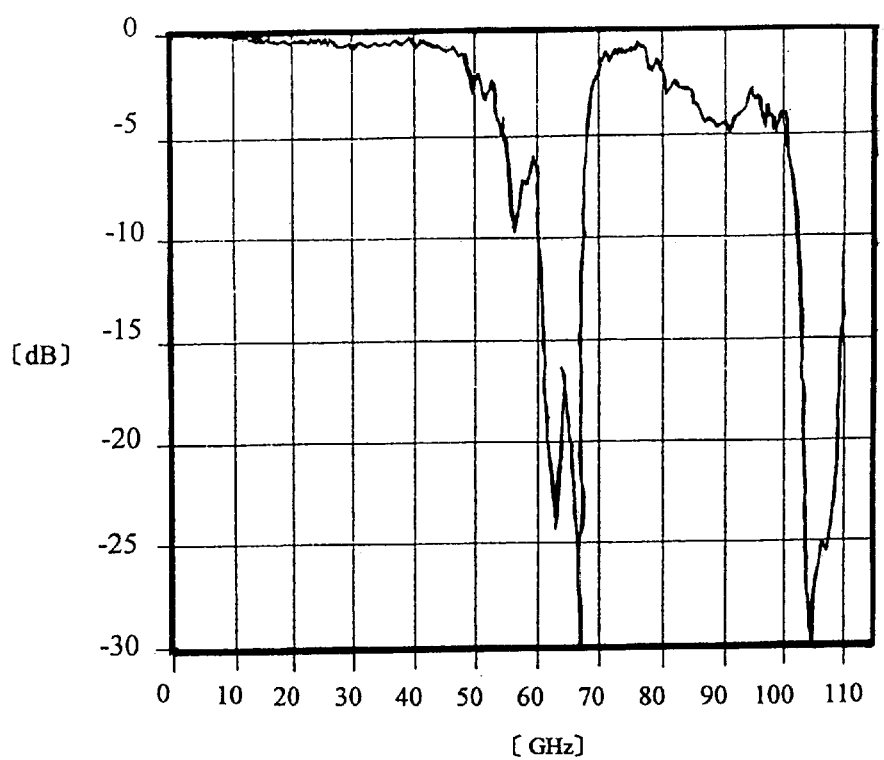
FIG. 11a shows the insertion loss and FIG. 11b shows the return loss.
Figure 11B:
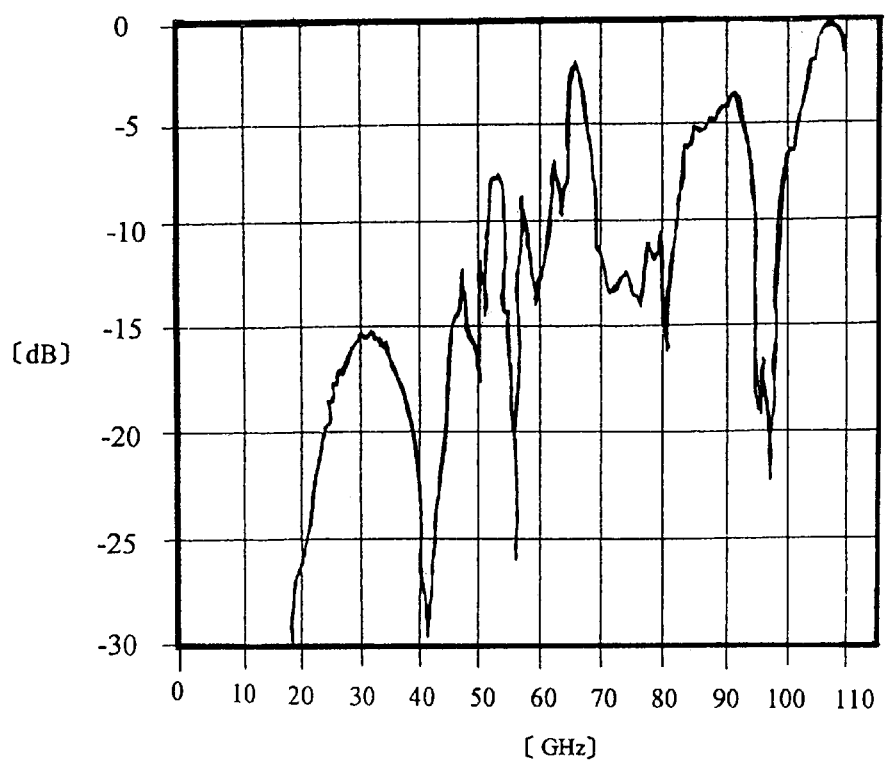

As is seen from FIG. 11, in the high-frequency package according to Example 1, ripples were observed in the vicinity of 65 GHz by the influence of the distances W and L, but in the 72–78 GHz band which is applicable to a mobile radar, or the like, the insertion loss and return loss thereof were low, which were $S_{21}>-1.5$ dB and $S_{11}<-10$ dB.

Figure 12A:
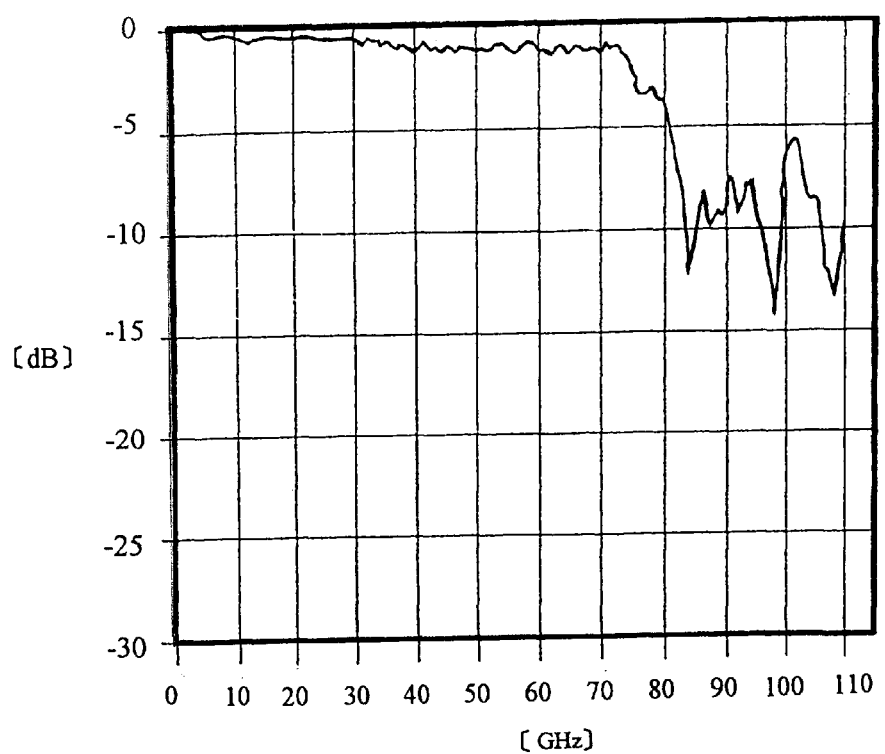
FIG. 12a shows the insertion loss and FIG. 12b shows the return loss.
Figure 12B:
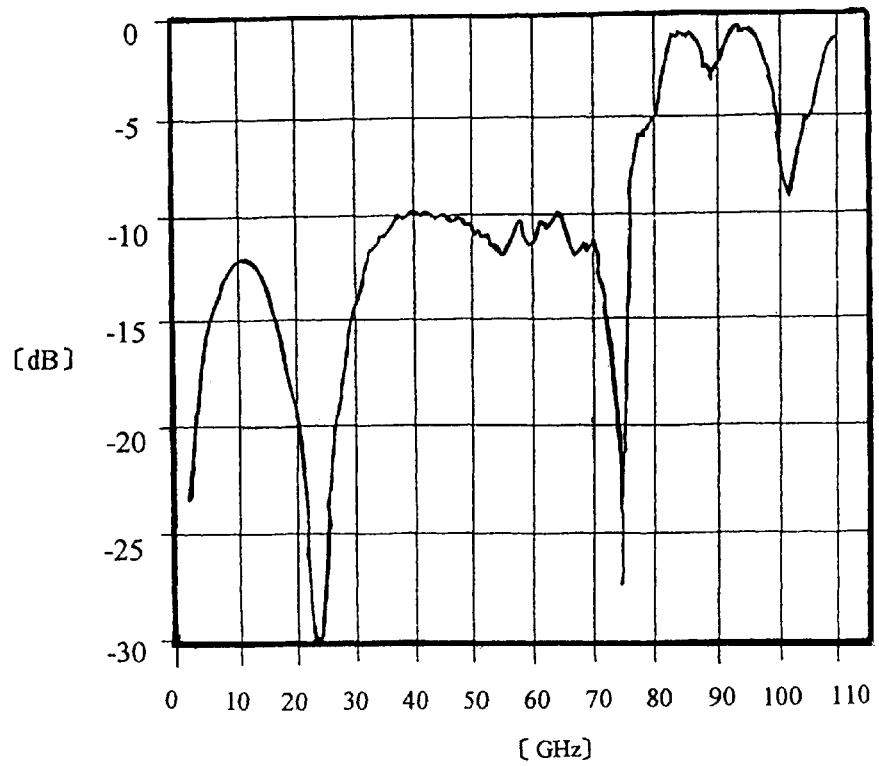

As is seen from FIG. 12, in the high-frequency package according to Example 2, no ripples were observed until about 72 GHz. At about 72 GHz or less, the insertion loss and return loss thereof were low, which were $S_{21}>-1.3$ dB and $S_{11}<-10$ dB. Even when the width $w_1$ of the signal line 14 and the gap $g_1$ were set to be relatively small, it was found that the insertion loss was small, so that high-frequency signals in the millimeter wave band can be transmitted.

Figure 13A:
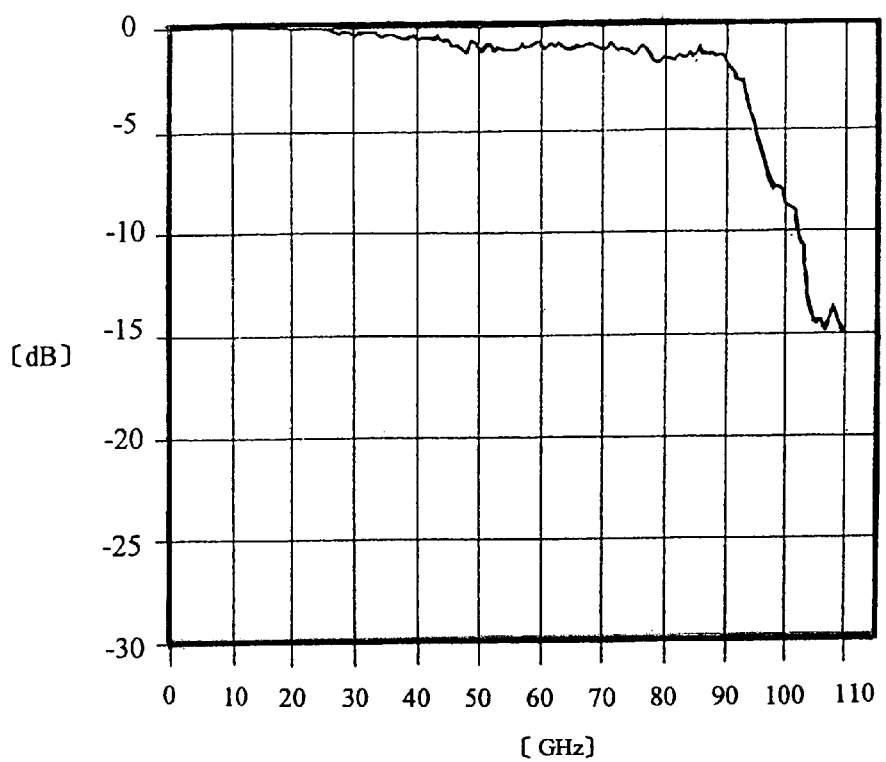
FIG. 13a shows the insertion loss and FIG. 13b shows the return loss.
Figure 13B:
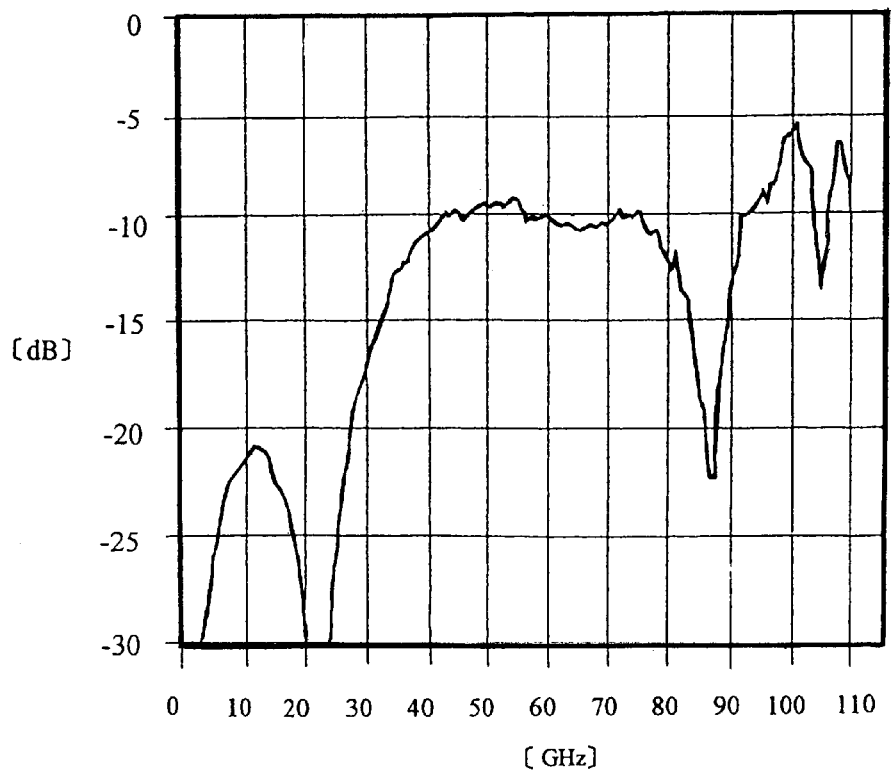

As is seen from FIG. 13, in the high-frequency package according to Example 3, no ripples were observed until about 90 GHz. At about 90 GHz or less, the insertion loss and return loss thereof were extremely low, which were $S_{21}>-1.7$ dB and $S_{11}<-9.5$ dB.

Figure 14A:
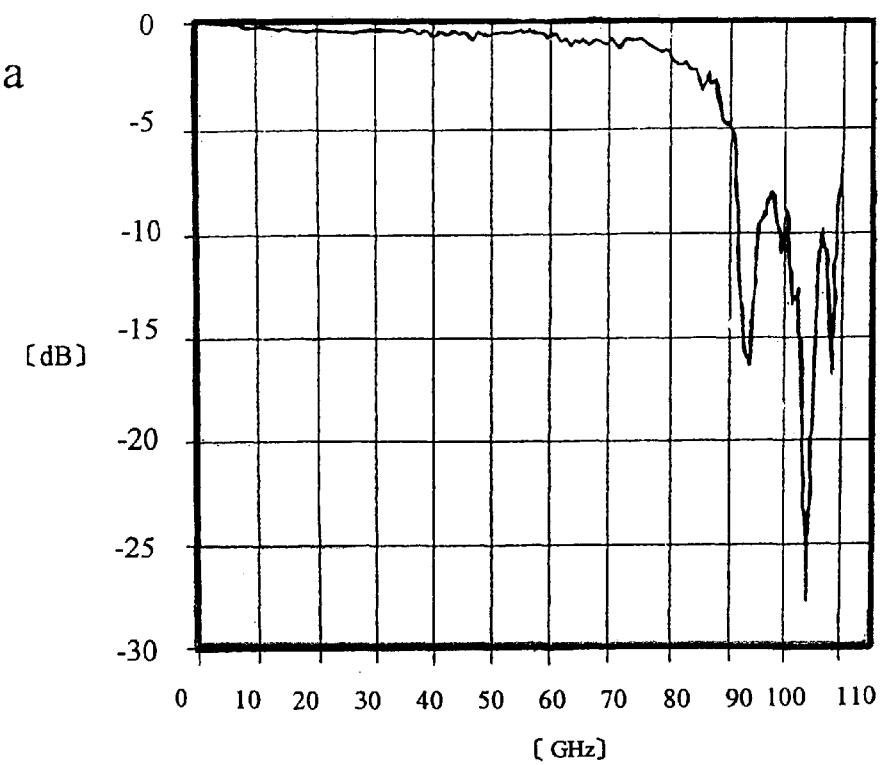
FIG. 14a shows the insertion loss and FIG. 14b shows the return loss.
Figure 14B:
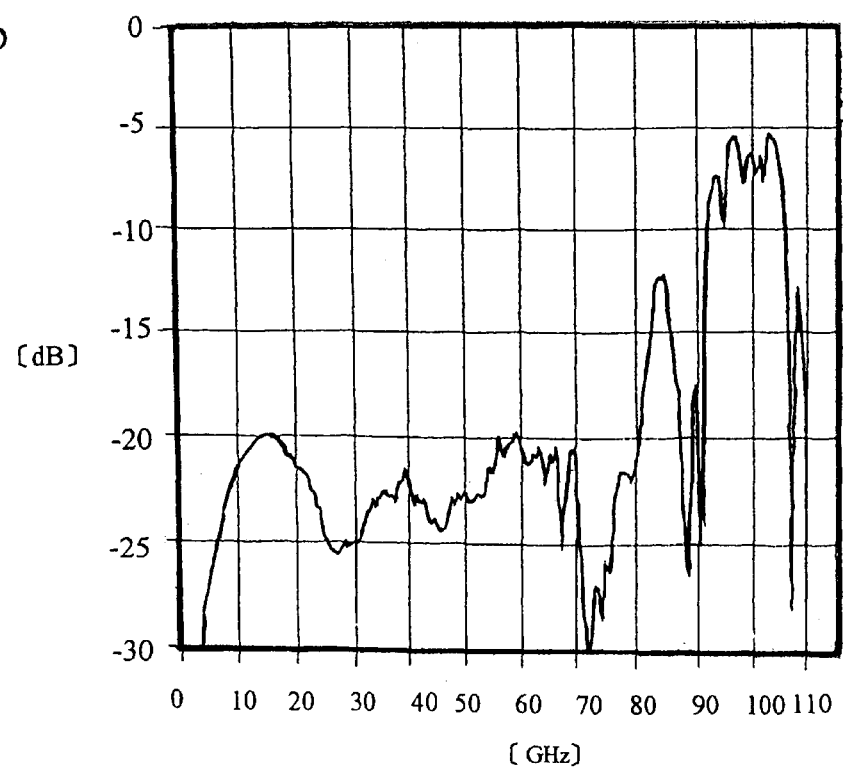

As is seen from FIG. 14, in the high-frequency package according to Example 4, since the conductive vias 35a and 35b were formed on arcs having a radius of 0.52 mm whose centers were the conductive vias 17, in the 60–78 GHz band, the insertion loss and return loss thereof were lower than those in Example 2, which were $S_{21}>-1.5$ dB and $S_{11}<-20$ dB.

On the other hand, in the high-frequency package according to Comparative Example 1 wherein no conductive vias 25a and 25b were formed, as is seen from FIG. 15, sharp ripples were observed at every 10–11 GHz interval. Therefore, the use of this system in the high-frequency band was difficult.

In the high-frequency package according to Comparative Example 2 wherein the conductive vias 25a and 25b were formed only in some parts, $S_{21}$ was −2.5 dB or less at about 40 GHz or more. Therefore, the use of this system in the band of millimeter wavelengths was difficult.

As is obvious from the above results, since the conductive vias 25a and 25b were formed on both sides with the signal lines 14–16 between at prescribed intervals in the high-frequency packages according to Examples 1–3, the reduction of the insertion losses and return losses was attained.

In the high-frequency package according to Example 4, since the distance $W_s$ between the conductive via 35a or 35b formed close to the conductive via 17 and the conductive via 17 was set to be larger than the distances W between the signal lines 14–16 and the conductive via 35c or 35d formed on both sides thereof, the reduction of the insertion loss and return loss was attained.

The examination results of insertion losses and return losses of high-frequency packages according to Examples 5 and 6, and Comparative Examples 3 and 4 are described below.

In Table 3, the thickness T of a dielectric substrate 81, the dielectric constant $\epsilon_r$ thereof, the widths $w_1$–$w_3$ of signal lines 84–86, the distance $L_0$ between a conductive via 87 and the end portion 84b or 85b of the signal line 84 or 85, the gaps $g_1$–$g_3$ between the signal lines 84–86 and grounds 92 or 94, the diameter $d_1$ of the conductive via 87 and the diameter $d_2$ of a conductive via 95a or 95b (both in FIG. 8), the distance $L_1$ between a ring-shaped frame 82 and the end portion 84b of the signal line 84, the distance $L_2$ between the ring-shaped frame 82 and the end portion 85b of the signal line 85, the thickness $L_w$ of the ring-shaped frame 82, and the height $T_w$ thereof, in the high-frequency packages according to Examples 5 and 6, and Comparative Examples 3 and 4, respectively, are shown.

As Comparative Example 3, a high-frequency package wherein the constituent of a ring-shaped frame was Koval, the thickness thereof was thinner than those in Examples so as not to lie over the signal lines, and no conductive vias 95a and 95b were formed (here, only the distance L matched the normal value) was prepared, while as Comparative Example 4, a high-frequency package wherein the constituent of a ring-shaped frame was Koval, the thickness thereof was thinner than those in Examples so as not to lie over the signal lines, and the conductive vias 95a and 95b were formed only on both sides of signal lines 86 on the lower surface in the vicinities of conductive vias 87, not on both sides of signal lines 84 and 85 on the upper surface (here, only the distance L matched the normal value) was prepared. The insertion losses and return losses were measured with the same experiment conditions as those in Examples.

As is obvious from Table 4, the intervals D and distances L in Examples 5 and 6 match the normal values, respectively. On the other hand, as Comparative Example 3, the high-frequency package wherein no conductive vias 95a and 95b were formed (here, only the distance L matched the normal value) was selected, while as Comparative Example 4, the high-frequency package wherein the conductive vias 95a and 95b were formed only on both sides of the signal lines 86 on the lower surface in the vicinities of the conductive vias 87, not on both sides of the signal lines 84 and 85 on the upper surface (here, only the distance L matched the normal value) was selected.

As a test apparatus, a network analyzer was used. The insertion losses $S_{21}$ and return losses $S_{11}$ of the high-frequency packages according to Examples 5 and 6, and Comparative Examples 3 and 4 were measured with a lid 96 (FIG. 8) removed, using an air coplanar probe having a ground signal ground pitch of 0.25 mm.

Figure 17A:
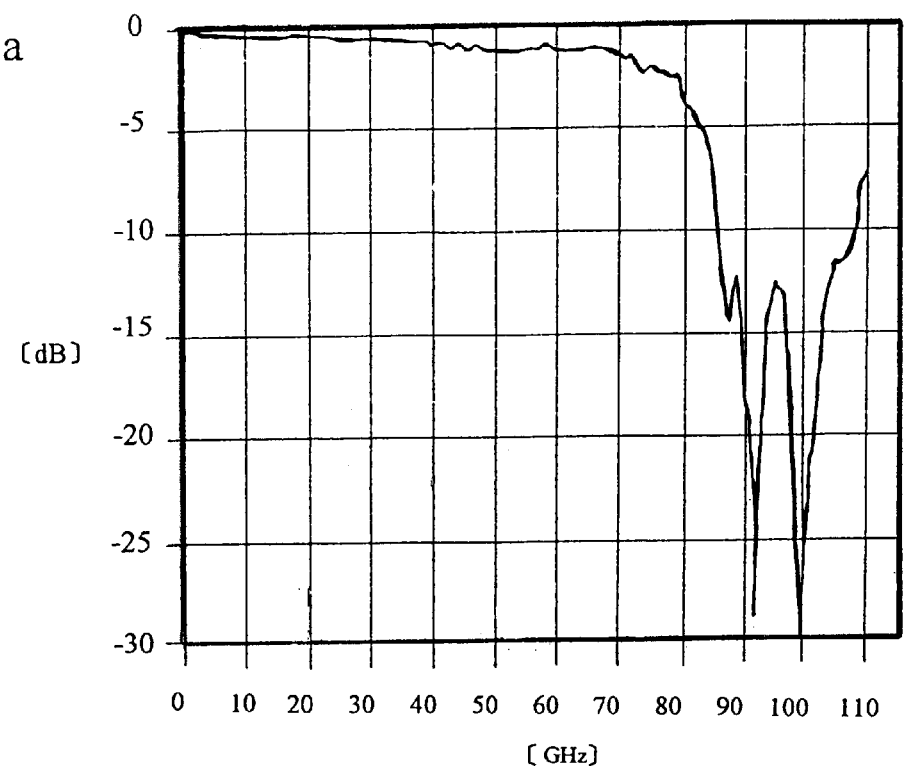
FIG. 17a shows the insertion loss and FIG. 17b shows the return loss.
Figure 17B:
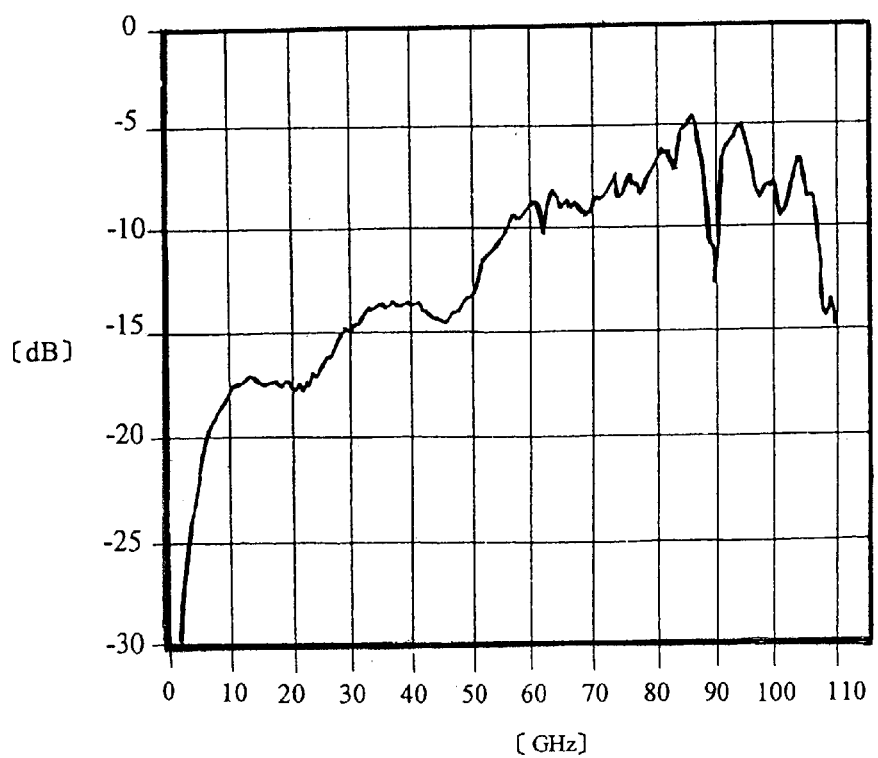
Figure 18A:
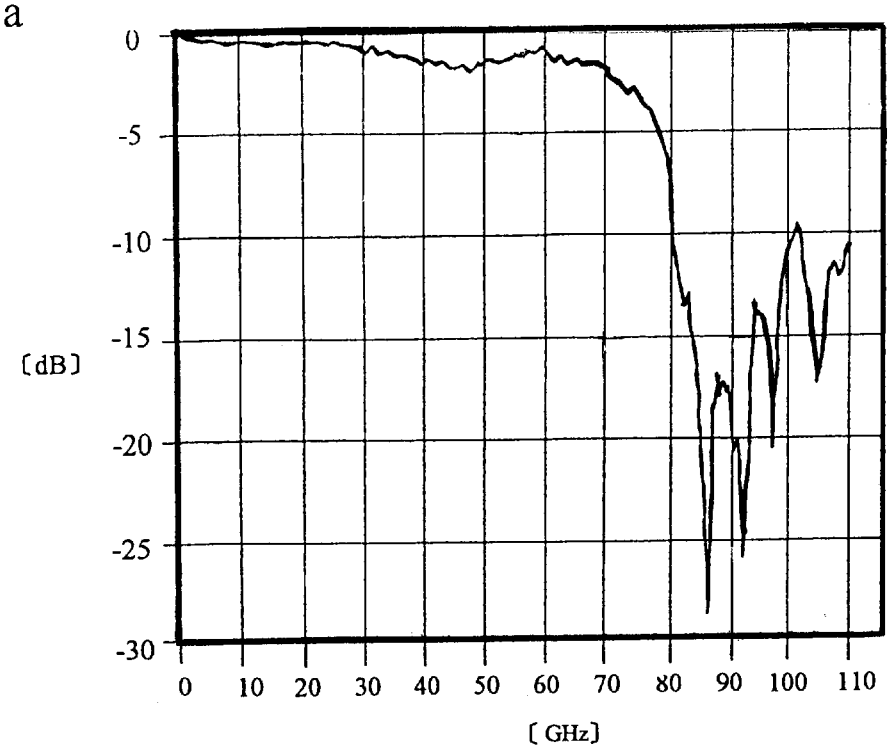
FIG. 18a shows the insertion loss and FIG. 18b shows the return loss.
Figure 18B:
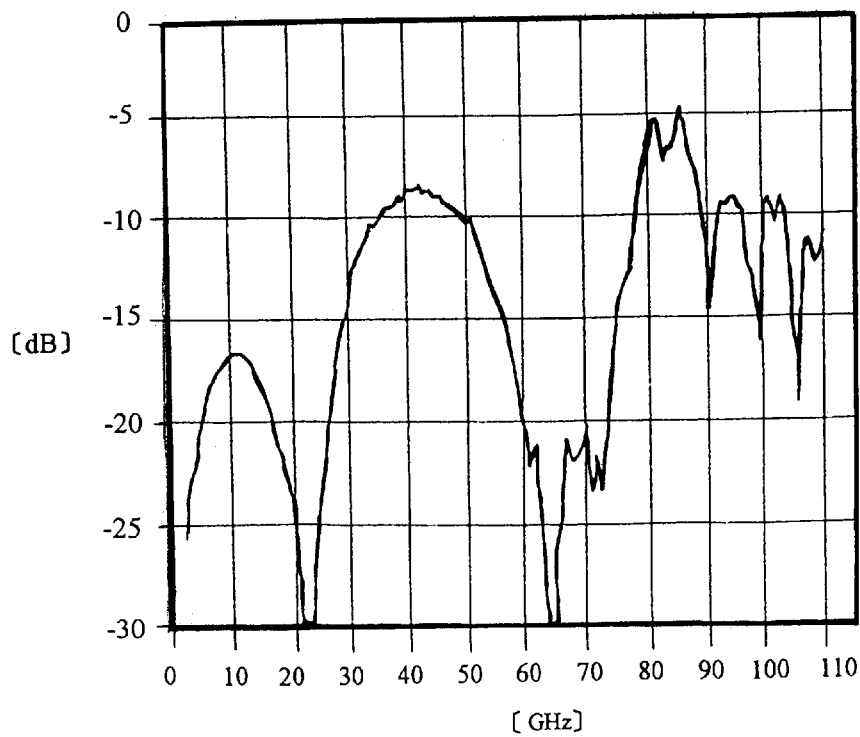

FIGS. 17 and 18 are graphs indicating the measurement results of the high-frequency packages according to

TABLE 3

| Item Unit | T mm | $\epsilon_r$ — | $w_1$ mm | $w_2$ mm | $w_3$ mm | $L_0$ mm | $g_1$ mm | $g_2$ mm | $g_3$ mm | $d_1$ mm | $d_2$ mm | $T_W$ mm | $L_1$ mm | $L_2$ mm | $L_W$ mm |
|---|---|---|---|---|---|---|---|---|---|---|---|---|---|---|---|
| Example 5 | 0.2 | 9.0 | 0.12 | 0.12 | 0.12 | 0.6 | 0.07 | 0.07 | 0.07 | 0.13 | 0.16 | 0.3 | 0.7 | 0.3 | 1.25 |
| Example 6 | 0.2 | 9.0 | 0.12 | 0.12 | 0.12 | 0.6 | 0.07 | 0.07 | 0.07 | 0.13 | 0.16 | 0.3 | 0.3 | 0.3 | 1.65 |
| Comparative Example 3 | 0.3 | 9.0 | 0.18 | 0.18 | 0.18 | 0.6 | 0.1 | 0.1 | 0.1 | 0.14 | — | 0.2 | 0.95 | 0.95 | 0.35 |
| Comparative Example 4 | 0.3 | 9.0 | 0.18 | 0.18 | 0.18 | 0.6 | 0.1 | 0.1 | 0.1 | 0.14 | 0.14 | 0.2 | 0.95 | 0.95 | 0.35 |

Note)
In Example 6, a conductive via 17 is connected through a land 0.18 mm square being formed in the end portion 14a of a signal line (both shown in FIG. 8).

The interval D between the conductive vias 95a and 95a, or 95b and 95b, the distance W between the signal lines 84, 85, or 86 and the conductive via 95a or 95b, and the distance L between the conductive vias 87, in the high-frequency packages according to Examples 5 and 6, and Comparative Examples 3 and 4, respectively, are shown in Table 4 (set point column).

Here, in Table 4, the normal values of the interval D, and the distances W and L of each high-frequency package according to Examples 5 and 6, and Comparative Examples 3 and 4 which are estimated, based on the thickness T of the dielectric substrate 81 and the wavelength λ in the case where the high frequency to be utilized is 70 GHz (the value to substitute is 80 GHz), are summarized. Whether the set points satisfy the normal values or not is indicated by marking a circle or a cross.

Figure 19A:
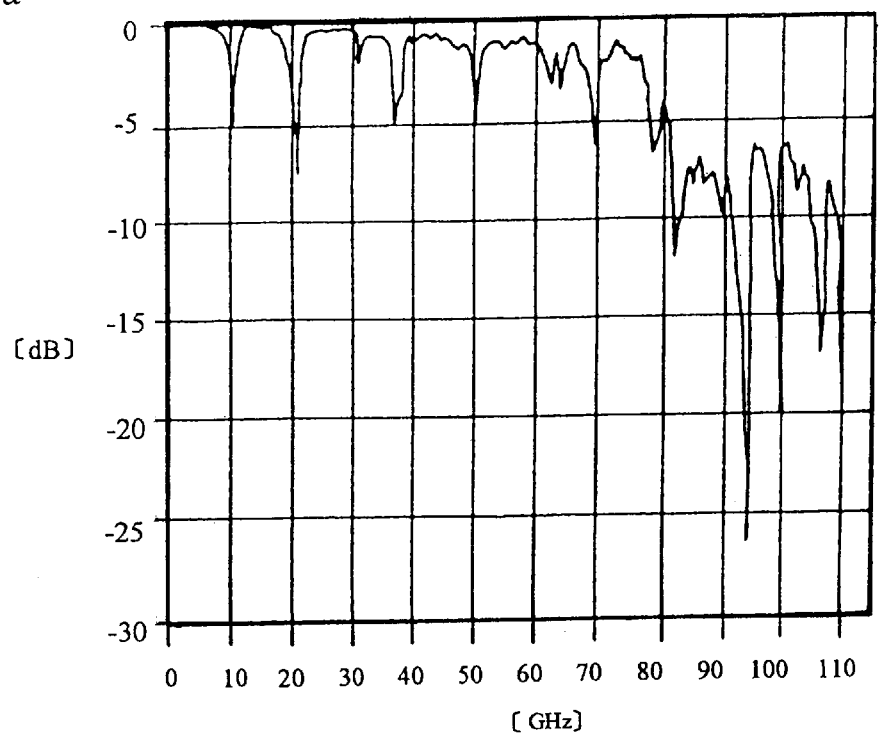
FIG. 19a shows the insertion loss and FIG. 19b shows the return loss.
Figure 19B:
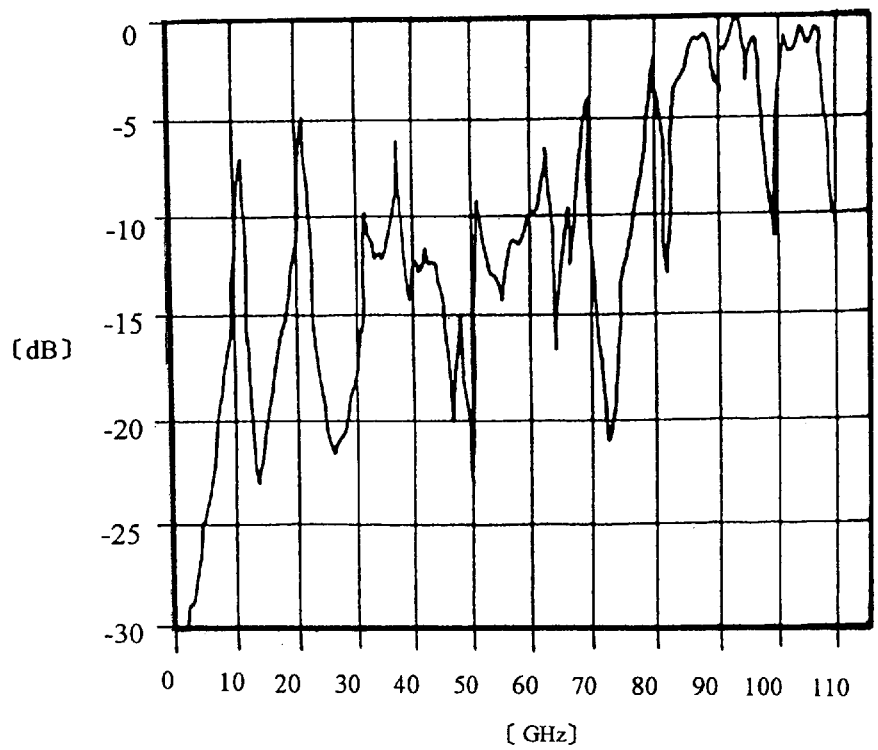
Figure 20A:
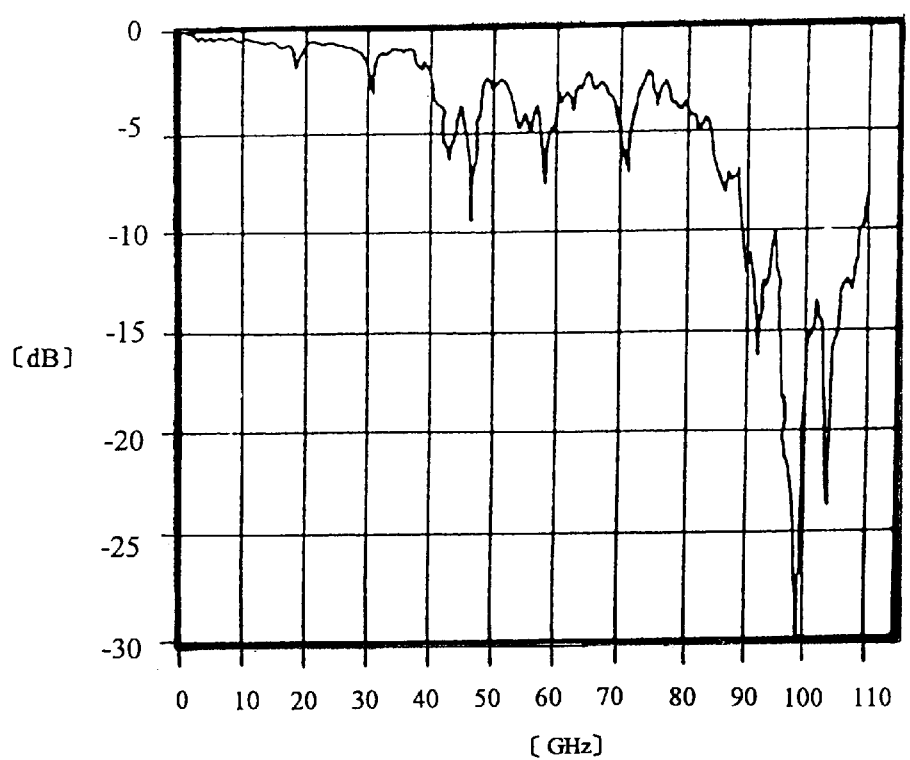
FIG. 20a shows the insertion loss and FIG. 20b shows the return loss.
Figure 20B:
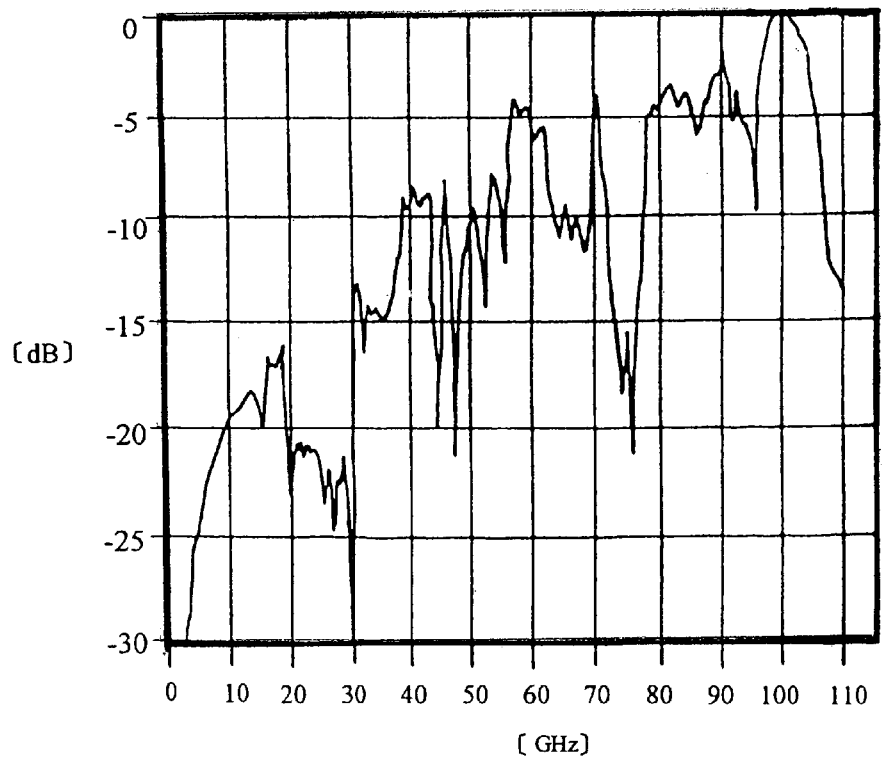

Examples 5 and 6, using the network analyzer. Figures a show the insertion losses, while figures b show the return losses. FIGS. 19 and 20 are graphs indicating the measurement results of the high-frequency packages according to Comparative Examples 3 and 4, using the network analyzer. Figures a show the insertion losses, while figures b show the return losses.

As is seen from FIG. 17, in the high-frequency package according to Example 5, in the band from DC to quasi-millimeter waves of 30 GHz or less, the insertion loss and return loss thereof were low, which were $S_{21}>-0.6$ dB and $S_{11}<-15$ dB. Furthermore, the transmission was possible in a wide band up to 70–80 GHz, so that the usable band widened to that of millimeter wavelengths.

As is seen from FIG. 18, in the high-frequency package according to Example 6, since the buried portions of the

TABLE 4

| | Reference | | | wavelength | | | D (mm) | | | W (mm) | | L (mm) | |
|---|---|---|---|---|---|---|---|---|---|---|---|---|---|
| Item | GHz | λ (mm) | Normal value | Set point | Result | Normal value | Set point | Result | Normal value | Set point | Normal value | Result |
| Example 5 | 70 | 4.29 | 0.71> | 0.35 | ○ | | | | | | | |
| | 80 | 3.75 | | | | 0.31> | 0.34 | X | 1.25> | 1.05 | >0.4 | ○ |
| Example 6 | 70 | 4.29 | 0.71> | 0.35 | ○ | | | | | | | |
| | 80 | 3.75 | | | | 0.31> | 0.34 | X | 1.25> | 1.05 | >0.4 | ○ |
| Comparative Example 3 | 70 | 4.29 | 0.71> | — | X | | | | | | | |
| | 80 | 3.75 | | | | 0.31> | — | X | 1.25> | 1.05 | >0.6 | ○ |
| Comparative Example 4 | 70 | 4.29 | 0.71> | 1.05 | X | | | | | | | |
| | 80 | 3.75 | | | | 0.31> | 0.52 | X | 1.25> | 1.05 | >0.6 | ○ | signal lines in the ring-shaped frame were larger, the insertion loss and return loss increased a little around 40 GHz. But the transmission was possible in a wide band up to 70–80 GHz except around 40 GHz. In the millimeter wave band of 60–70 GHz, the insertion loss and return loss thereof were low, which were $S_{21}>1.2$ dB and $S_{11}<-20$ dB. As to the increase in return loss around 40 GHz in Example 6, the maximum value of return loss can be shifted to the low frequency range by making L larger, while the maximum value thereof can be shifted to the high frequency range by making L smaller. Therefore, the design can be optimized in accordance with the signal frequency to be used without any difficulties.

On the other hand, in the high-frequency package according to Comparative Example 3 wherein no conductive vias 95a and 95b were formed, as is seen from FIG. 19, sharp ripples were observed at every 10–11 GHz interval. Therefore, the use of this system in the high-frequency band was difficult.

In the high-frequency package according to Comparative Example 4 wherein the conductive vias 95a and 95b were formed only in some parts, as is seen from FIG. 20, $S_{21}$ was −2.5 dB or less at about 40 GHz or more. Therefore, the use of this system in the millimeter wave band was difficult.

As is obvious from the above results, since the conductive vias 95a and 95b were formed on both sides with the signal lines 84–86 between at prescribed intervals in the high-frequency packages according to Examples 5 and 6, the reduction of the insertion losses and return losses was attained.

What is claimed is:

1. A high-frequency package, comprising a ring-shaped frame,
    first and second signal lines being formed so as to face each other, with the ring-shaped frame between, in inside and outside regions separated by the ring-shaped frame, and
    first and second grounds being formed around the first and second signal lines with gaps interposed between in the same plane, respectively, on one main surface side of a dielectric substrate;
    comprising third signal lines, and
    a third ground being formed around the third signal lines with gaps interposed in between in the same plane on the other main surface side of the dielectric substrate;
    wherein first conductive vias for vertically connecting each of one end portions of the first and second signal lines with both end portions of the third signal line are formed; and
    a plurality of second conductive vias for vertically connecting the first and second grounds with the third ground are formed at prescribed intervals on both sides with the first to third signal lines between.

2. A high-frequency package according to claim 1, wherein a prescribed interval D between the second conductive vias is set within the range of $$D<\lambda/(2\times\epsilon_r^{1/2}),$$

$\epsilon_r$ is the dielectric constant of the dielectric substrate, and
    $\lambda$ is the wavelength in the air of a high-frequency signal propagating through the first to third signal lines and first conductive vias.

3. A high-frequency package according to claim 1, wherein distances W between the first to third signal lines and the second conductive vias are set within the range of $$W<\lambda/(4\times\epsilon_r^{1/2})$$

Where
    $\epsilon_r$ is the dielectric constant of the dielectric substrate, and
    $\lambda$ is the wavelength in the air of a high-frequency signal propagating through the first to third signal lines and first conductive vias.

4. A high-frequency package according to claim 2, wherein distances W between the first to third signal lines and the second conductive vias are set within the range of $$W<\lambda/(4\times\epsilon_r^{1/2}),$$

Where
    $\epsilon_r$ is the dielectric constant of the dielectric substrate, and
    $\lambda$ is the wavelength in the air of a high-frequency signal propagating through the first to third signal lines and first conductive vias.

5. A high-frequency package according to claim 1, wherein the second conductive vias proximate to the first conductive vias are arranged on and/or outside arcs whose centers are the first conductive vias, having such a radius $W_s$ as makes the relationship $W_s>W$ hold,
    where $W_s$ is the distance between the center of the first conductive via and at least one of the second conductive vias proximate to the first conductive via, and
    W shows the distances between the second conductive vias except the second conductive vias proximate to the first conductive vias and the first to third signal lines.

6. A high-frequency package according to claim 2, wherein the second conductive vias proximate to the first conductive vias are arranged on and/or outside arcs whose centers are the first conductive vias, having such a radius $W_s$ as makes the relationship $W_s>W$ hold,
    where $W_s$ is the distance between the center of the first conductive via and at least one of the second conductive vias proximate to the first conductive via, and
    W shows the distances between the second conductive vias except the second conductive vias proximate to the first conductive vias and the first to third signal lines.

7. A high-frequency package according to claim 1, wherein a distance L between the first conductive vias is set within the range of $$2\times T<L<\lambda/(\epsilon_r^{1/2}),$$

where
    $\epsilon_r$ is the dielectric constant of the dielectric substrate,
    $\lambda$ is the wavelength in the air of a high-frequency signal propagating through the first to third signal lines and first conductive vias, and
    T is the thickness of the dielectric substrate.

8. A high-frequency package according to claim 2, wherein a distance L between the first conductive vias is set within the range of $$2\times T<L<\lambda/(\epsilon_r^{1/2}),$$

where
    $\epsilon_r$ is the dielectric constant of the dielectric substrate,
    $\lambda$ is the wavelength in the air of a high-frequency signal propagating through the first to third signal lines and first conductive vias, and
    T is the thickness of the dielectric substrate.

9. A high-frequency package, comprising a ring-shaped frame made of an insulating material, first and second signal lines being formed so as to face each other with the ring-shaped frame between in the inside and outside regions separated by the ring-shaped frame, and a first ground being formed around the first and second signal lines with gaps interposed between in the same plane on one main surface side of a dielectric substrate;

wherein at least one of the first and second signal lines is formed so as to partially lie under the ring-shaped frame;

comprising third signal lines, and a second ground being formed around the third signal lines with gaps interposed in between in the same plane on the other main surface side of the dielectric substrate;

wherein first conductive vias for vertically connecting each of one end portions of the first and second signal lines with both end portions of the third signal line are formed; and a plurality of second conductive vias for vertically connecting the first ground with the second ground are formed at prescribed intervals on both sides with the first to third signal lines between.

10. A high-frequency package according to claim 9, wherein an interval D between the second conductive vias is set within the range of $$D < \lambda/(2 \times \epsilon_r^{1/2}),$$

where $\epsilon_r$ is the dielectric constant of the dielectric substrate, and $\lambda$ is the wavelength in the air of a high-frequency signal propagating through the first to third signal lines and first conductive vias.

11. A high-frequency package according to claim 9, wherein conductive vias for shielding are formed in the interior of the ring-shaped frame of an insulating material.

12. A high-frequency package according to claim 9, wherein a metalized layer is formed on the top of the ring-shaped frame.

13. A high-frequency package according to claim 9, wherein a plurality of semiconductor device mounting areas are formed on one main surface side of the dielectric substrate, while a plurality of openings for semiconductor device mounting are correspondingly formed in the ring-shaped frame, as a whole which is convertible to multichip module (MCM) packages.

* * * * *